(12) United States Patent
Shin

(10) Patent No.: US 9,761,593 B2
(45) Date of Patent: Sep. 12, 2017

(54) SEMICONDUCTOR DEVICE

(71) Applicant: Samsung Electronics Co., Ltd., Suwon-si, Gyeonggi-do (KR)

(72) Inventor: Seok-ho Shin, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/214,145

(22) Filed: Jul. 19, 2016

(65) Prior Publication Data

US 2016/0329338 A1  Nov. 10, 2016

Related U.S. Application Data

(63) Continuation of application No. 14/645,954, filed on Mar. 12, 2015, now Pat. No. 9,431,324.

(30) Foreign Application Priority Data

Apr. 14, 2014 (KR) .......................... 10-2014-0044424

(51) Int. Cl.
*H01L 21/20* (2006.01)
*H01L 27/108* (2006.01)
(Continued)

(52) U.S. Cl.
CPC .. *H01L 27/10885* (2013.01); *H01L 21/31111* (2013.01); *H01L 21/76802* (2013.01);
(Continued)

(58) Field of Classification Search
CPC ......... H01L 2924/0002; H01L 2924/00; H01L 21/31111; H01L 21/76802; H01L 23/481; H01L 27/10852; H01L 27/10855; H01L 27/10876; H01L 27/10885; H01L 27/10888; H01L 27/10891; H01L 27/10894
(Continued)

(56) References Cited

U.S. PATENT DOCUMENTS

RE36,938 E    10/2000  Chan et al.
6,221,713 B1 *  4/2001  Huang .............. H01L 27/10888
                                                    257/E21.649
(Continued)

FOREIGN PATENT DOCUMENTS

JP    2011-192800    9/2011
KR    10-2011-0001693    1/2011
KR    10-2011-0024494    3/2011

*Primary Examiner* — Mohammed Shamsuzzaman
(74) *Attorney, Agent, or Firm* — Myers Bigel, P.A.

(57) ABSTRACT

A semiconductor device includes: a substrate having a plurality of active regions; a plurality of bit lines extending in a first direction, the plurality of bit lines being separate from the substrate with an insulating layer therebetween; a plurality of first insulating lines extending in a second direction that is different from the first direction, wherein the plurality of first insulating lines intersect the plurality of bit lines and have upper surfaces having levels which are higher than those of upper surfaces of the plurality of bit lines relative to the substrate; and a plurality of first contact structures connected to the plurality of active regions, the plurality of first contact structures being disposed in an area defined by the plurality of bit lines and the plurality of first insulating lines.

14 Claims, 25 Drawing Sheets

(51) Int. Cl.
  *H01L 23/48* (2006.01)
  *H01L 21/311* (2006.01)
  *H01L 21/768* (2006.01)
  *H01L 29/06* (2006.01)
(52) U.S. Cl.
  CPC ...... *H01L 23/481* (2013.01); *H01L 27/10852* (2013.01); *H01L 27/10855* (2013.01); *H01L 27/10876* (2013.01); *H01L 27/10888* (2013.01); *H01L 27/10891* (2013.01); *H01L 27/10894* (2013.01); *H01L 29/0649* (2013.01); *H01L 2924/0002* (2013.01)
(58) Field of Classification Search
  USPC ........ 257/532, 296, 773, 751, 306; 438/396, 438/618, 637, 239, 153
  See application file for complete search history.

(56) References Cited

U.S. PATENT DOCUMENTS

| | | | |
|---|---|---|---|
| 8,193,074 B2 | 6/2012 | Tanaka | |
| 9,048,293 B2* | 6/2015 | Lee | H01L 27/10855 |
| 2002/0052068 A1* | 5/2002 | Juengling | H01L 21/0331 438/153 |
| 2002/0063272 A1* | 5/2002 | Miyajima | H01L 22/34 257/296 |
| 2006/0255384 A1* | 11/2006 | Baars | H01L 21/76816 257/296 |
| 2007/0037345 A1* | 2/2007 | Manger | H01L 27/10855 438/239 |
| 2007/0082448 A1* | 4/2007 | Kim | H01L 27/10876 438/268 |
| 2007/0152257 A1* | 7/2007 | Park | H01L 21/76804 257/308 |
| 2010/0127398 A1* | 5/2010 | Kim | H01L 21/76831 257/773 |
| 2010/0164114 A1* | 7/2010 | Kang | H01L 21/76816 257/773 |
| 2011/0079836 A1* | 4/2011 | Lin | H01L 27/10826 257/306 |
| 2012/0001346 A1 | 1/2012 | Kim et al. | |
| 2012/0139028 A1 | 6/2012 | Park et al. | |
| 2012/0187535 A1* | 7/2012 | Lee | H01L 27/10855 257/532 |
| 2012/0211813 A1* | 8/2012 | Taketani | H01L 27/10814 257/296 |
| 2012/0217559 A1 | 8/2012 | Kim et al. | |
| 2013/0127013 A1 | 5/2013 | Park et al. | |
| 2013/0256769 A1* | 10/2013 | Jeong | H01L 27/1052 257/296 |
| 2014/0077333 A1* | 3/2014 | Son | H01L 21/7682 257/522 |
| 2014/0112050 A1* | 4/2014 | Park | H01L 27/10882 365/72 |
| 2015/0061134 A1* | 3/2015 | Lee | H01L 21/764 257/751 |
| 2015/0132942 A1* | 5/2015 | Kim | H01L 27/10814 438/618 |
| 2015/0132945 A1* | 5/2015 | Park | H01L 27/10894 438/637 |

\* cited by examiner

SEMICONDUCTOR DEVICE

CROSS-REFERENCE TO RELATED APPLICATIONS

The present application is a continuation application of and claims priority from U.S. patent application Ser. No. 14/645,954, filed on Mar. 12, 2015, which claims the benefit of Korean Patent Application No. 10-2014-0044424, filed on Apr. 14, 2014, in the Korean Intellectual Property Office, the disclosure of which is incorporated herein in its entirety by reference.

BACKGROUND

The inventive concept relates to a semiconductor device, and more particularly, to a semiconductor device including a landing pad.

Elements of semiconductor devices have been reduced or minimized according to the high integration of the semiconductor devices. Accordingly, the width of an interconnection line between the elements and the cross-sectional area of a contact plug that is connected between the elements has been gradually reduced. Due to this, when a lower capacitor electrode is connected to a contact plug having a small cross-sectional area, a contact area with the contact plug may be limited and thus there may be a limit in lowering contact resistance.

SUMMARY

The inventive concept provides a semiconductor device in which a contact plug having a small cross-sectional area is improved and thus contact resistance occurring when connecting the contact plug to a lower capacitor electrode is lowered.

According to an aspect of the inventive concept, there is provided a semiconductor device including: a substrate having a plurality of active regions; a plurality of bit lines extending in a first direction, the plurality of bit lines being separate from the substrate with an insulating layer therebetween; a plurality of first insulating lines extending in a second direction that is different from the first direction, wherein the plurality of first insulating lines intersect the plurality of bit lines and have upper surfaces having levels which are higher than those of upper surfaces of the plurality of bit lines relative to the substrate; and a plurality of first contact structures connected to the plurality of active regions, the plurality of first contact structures being disposed in an area defined by the plurality of bit lines and the plurality of first insulating lines.

The semiconductor device may further include: a plurality of second insulating lines extending in a third direction that is different from the second direction, the plurality of second insulating lines intersecting the plurality of first insulating lines; and a plurality of second contact structures connected to the plurality of first contact structures, the plurality of second contact structures being disposed in an area isolated by the plurality of first insulating lines and the plurality of second insulating lines, wherein one of the first contact structures is disposed to be connected to one of the second contact structures corresponding thereto.

The levels of upper surfaces of the plurality of first insulating lines may be approximately equal to those of upper surfaces of the plurality of second insulating lines.

An upper surface of each of the plurality of second contact structures may be connected to a lower electrode of a capacitor.

The semiconductor device may further include an insulating spacer disposed at a sidewall of each of the plurality of bit lines, wherein the insulating spacer is formed of a same material as the plurality of first insulating lines.

The semiconductor device may further include a plurality of word lines buried in the substrate, wherein the plurality of first insulating lines overlap with the plurality of word lines.

The plurality of first contact structures may be formed of a same material as the plurality of second contact structures.

According to another aspect of the inventive concept, there is provided a semiconductor device including: a substrate having a plurality of active regions; a plurality of bit lines that intersect the plurality of active regions and extend in a first direction: a plurality of first insulating lines extending in a second direction that is different from the first direction; a plurality of first contact structures disposed in an area defined by the plurality of bit lines and the plurality of first insulating lines; a plurality of second insulating lines extending in a third direction that is different from the second direction; and a plurality of second contact structures filled in an area defined by the plurality of first insulating lines and the plurality of second insulating lines, wherein one of the second contact structures is disposed to be connected to one of the first contact structures corresponding thereto.

The plurality of second insulating lines may have a periodic structure based on the third direction.

The plurality of second insulating lines each may have a wavy structure based on the third direction.

The plurality of first contact structures each may have a horizontal cross-sectional area having a first size, and the plurality of second contact structures each may have a horizontal cross-sectional area having a second size that is larger than the first size.

At least one selected from a horizontal section of the first contact structures and a horizontal section of the second contact structures may have a parallelogram shape.

The semiconductor device may further include: an insulating pattern that defines a storage node hole for exposing an upper surface of each of the plurality of second contact structures; and a lower capacitor electrode connected to the upper surface of each of the plurality of second contact structures, the lower capacitor electrode being formed in the storage node hole.

The insulating pattern may include: a plurality of third insulating lines that contact the first insulating lines and extend in a fourth direction; and a plurality of fourth insulating lines that contact the upper surfaces of the second insulating lines and extend in a fifth direction.

The fourth direction may be the same as the second direction, and the fifth direction may be the same as the third direction.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

Figure 1A:
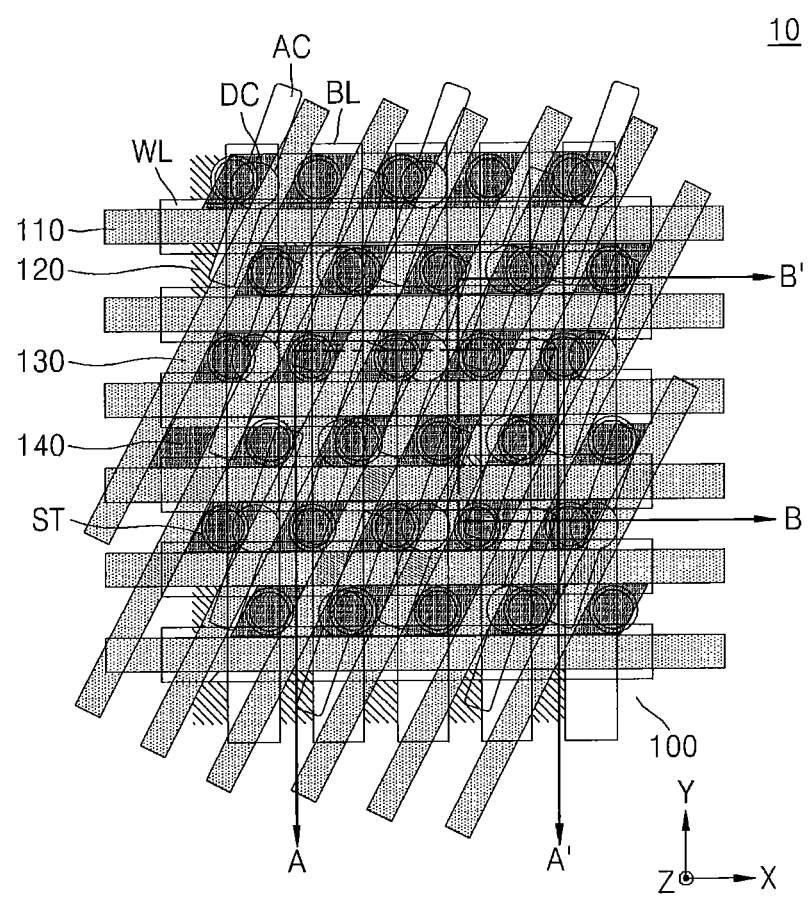
FIGS. 1A to 1C each are a schematic layout of a semiconductor device according to an embodiment of the inventive concept.

The inventive concept will now be described more fully with reference to the accompanying drawings, in which exemplary embodiments of the inventive concept are shown. In the drawings, the same elements are denoted by the same reference numerals and a repeated explanation thereof will not be given.

Hereinafter, the inventive concept will be described more fully with reference to the accompanying drawings, in which exemplary embodiments of the inventive concept are shown. The inventive concept may, however, be embodied in many different forms and should not be construed as being limited to the embodiments set forth herein; rather these embodiments are provided so that this disclosure will be thorough and complete, and will fully convey the concept of the inventive concept to one of ordinary skill in the art.

It will be understood that, although the terms "first", "second", "third", etc. may be used herein to describe various elements, components, regions, layers, and/or sections, these elements, components, regions, layers, and/or sections should not be limited by these terms. These terms are only used to distinguish one element, component, region, layer, or section from another region, layer, or section. Thus, a first element, component, region, layer, or section discussed below could be termed a second element, component, region, layer, or section without departing from the teachings of exemplary embodiments. For example, a first element may be referred to as a second element, and likewise, a second element may be referred to as a first element without departing from the scope of the inventive concept.

Unless otherwise defined, all terms (including technical and scientific terms) used herein are to be interpreted as is customary in the art to which this invention belongs. It will be further understood that terms in common usage should also be interpreted as is customary in the relevant art and not in an idealized or overly formal sense unless expressly so defined herein.

It should also be noted that in some alternative implementations, operations may be performed out of the sequences depicted in the flowcharts. For example, two operations shown in the drawings to be performed in succession may in fact be executed substantially concurrently or even in reverse of the order shown, depending upon the functionality/acts involved.

Modifications of shapes illustrated in the accompanying drawings may be estimated according to manufacturing processes and/or process variation. Accordingly, embodiments of the inventive concept should not be construed as being limited to a specific shape of an area illustrated in the present specification and should include a change in shape which may be caused in manufacturing processes. It will be understood that when an element or layer is referred to as being "on," "connected to," or "coupled to" another element or layer, it can be directly on, connected, or coupled to the other element or layer or intervening elements or layers may be present. In contrast, when an element is referred to as being "directly on," "directly connected to," or "directly coupled to" another element or layer, there are no intervening elements or layers present. Like numerals refer to like elements throughout the description. As used herein, the term "and/or" includes any and all combinations of one or more of the associated listed items.

Spatially relative terms, such as "beneath," "below," "lower," "above," "upper," and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations), and the spatially relative descriptors used herein may be interpreted accordingly.

The terminology used herein is for the purpose of describing particular embodiments only and is not intended to be limiting of the present inventive concept. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments are described herein with reference to cross-sectional views that are schematic illustrations of idealized embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and device structures thereon, as would be illustrated by a plan view of the device/structure.

FIG. 1A is a schematic layout of a cell array area of a semiconductor device 10 according to an embodiment of the inventive concept.

Referring to FIG. 1A, the semiconductor device 10 includes a plurality of active regions AC formed in a substrate 100. The plurality of active regions AC may be separately disposed, and each of the plurality of active regions AC may have a relatively long island shape having a major axis and a minor axis or vice versa.

A plurality of word lines WL extends parallel to one another across the active regions AC in a first direction. Although the first direction is the X-axis direction in FIG. 1A, the inventive concept is not limited thereto. The plurality of word lines WL may be buried in the substrate 100.

A plurality of bit line structures BL are formed on the substrate 100 and extend across the plurality of active regions AC in a second direction, which is different from the first direction. Although the second direction is the Y-axis direction in FIG. 1A, the inventive concept is not limited thereto. The plurality of bit line structures BL each include a bit line and a spacer formed at a sidewall of the bit line and are connected to the plurality of active regions AC via a plurality of direct contacts DC positioned under the bit line.

A plurality of first insulating lines 110 are formed on the plurality of bit line structures BL and extend parallel to one another in a third direction that is different from the second direction. Although the third direction is the X-axis direction in FIG. 1A, the inventive concept is not limited thereto. The plurality of first insulating lines 110 extend while covering upper surfaces and sidewalls of the plurality of bit line structures BL and the substrate 100 exposed between the plurality of bit line structures BL. Levels of upper surfaces of the plurality of first insulating lines 110 are higher than those of the upper surfaces of the plurality of bit line structures BL. In some embodiments, the third direction is the same as the first direction, and thus, the plurality of first insulating lines 110 may extend in the same direction as the plurality of word lines WL while overlapping the plurality of word lines WL. In some embodiments, the plurality of first insulating lines 110 each may have a fence shape.

A plurality of first contact structures 120 are formed in regions that are defined by the plurality of bit line structures BL and the plurality of first insulating lines 110. The plurality of first contact structures 120 are disposed to be connected to the plurality of active regions AC. In some embodiments, when the plurality of bit line structures BL are not perpendicular to the plurality of first insulating lines 110, a horizontal section of each of the plurality of first contact structures 120 may have a parallelogram shape. In some embodiments, when the plurality of bit line structures BL are perpendicular to the plurality of first insulating lines 110, as illustrated in FIG. 1A, a horizontal section of each of the plurality of first contact structures 120 has a rectangular shape. In some embodiments, the plurality of first contact structures 120 may be arranged at regular intervals along sidewalls of the plurality of bit line structures and may also be arranged at regular intervals along sidewalls of the plurality of first insulating lines 110. In some embodiments, the plurality of first contact structures 120 may be electrically connected to lower electrodes ST of capacitors. The plurality of first contact structures 120 may electrically connect the plurality of active regions AC to the lower electrodes ST of the capacitors.

A plurality of second insulating lines 130 are formed on the plurality of first contact structures 120 and the plurality of bit line structures BL and extend parallel to one another in a fourth direction that is different from the second direction and the third direction. Although the fourth direction is a direction between the X-axis direction and the Y-axis direction in FIG. 1A, the inventive concept is not limited thereto. The plurality of second insulating lines 130 cover upper surfaces and sidewalls of the plurality of bit line structures BL and portions of upper surfaces of the plurality of first contact structures 120 and contact sidewalls of the plurality of first insulating lines 110. The plurality of second insulating lines 130 extend without bisecting the upper surfaces of the plurality of first contact structures 120. Accordingly, only the upper surface of one first contact structure 120 formed in an area defined by a pair of adjacent bit line structures BL and a pair of adjacent first insulating lines 110 is exposed in an area defined by a pair of adjacent first insulating lines 110 and a pair of adjacent second insulating lines 130. In some embodiments, levels of the upper surfaces of the plurality of second insulating lines 130 may be approximately equal to those of upper surfaces of the plurality of first insulating lines 110. In some embodiments, the plurality of second insulating lines 130 may each have a fence shape.

A plurality of second contact structures 140 are formed in an area defined by the second insulating lines 130 and the first insulating lines 110. One second contact structure 140 is disposed to be connected to one first contact structure 120 corresponding thereto. The second contact structures 140 are electrically connected to the active regions AC via the first contact structures 120. When the third direction is the X-axis direction and the fourth direction is a direction between the X-axis direction and the Y-axis direction, a cross-section of each of the second contact structures 140 may have a parallelogram shape. In some embodiments, each of the first contact structures 120 may have a horizontal cross-sectional area of a first size, and each of the second contact structures 140 may have a horizontal cross-sectional area of a second size that is larger than the first size. In some embodiments, the second contact structures 140 may be arranged at regular intervals along sidewalls of the first insulating lines 110 and may also be arranged at regular intervals along sidewalls of the second insulating lines 130.

An insulating pattern (not shown), which defines a storage node hole for exposing a part of the upper surface or the entire upper surface of each of the second contact structures 140, may be formed on the upper surfaces of the first insulating lines 110, the upper surfaces of the second insulating lines 130, and the upper surfaces of the second contact structures 140. One storage node hole is formed so that only the upper surface of one of the second contact structure 140 corresponding thereto is exposed. The upper surfaces of the second contact structures 140, each of which is exposed in the storage node hole, may be connected to the lower electrodes ST of the capacitors. The lower electrodes ST of the capacitors are electrically connected to the first contact structures 120 and the active regions AC via the second contact structures 140.

In this manner, by increasing the levels of the first insulating lines 110 defining the first contact structures 120 to use the first insulating lines 110 as a structure defining the second contact structures 140 on the first contact structures 120, misalignment and contact failure between the first contact structures 120 and the second contact structures 140 may be greatly improved.

Figure 1B:
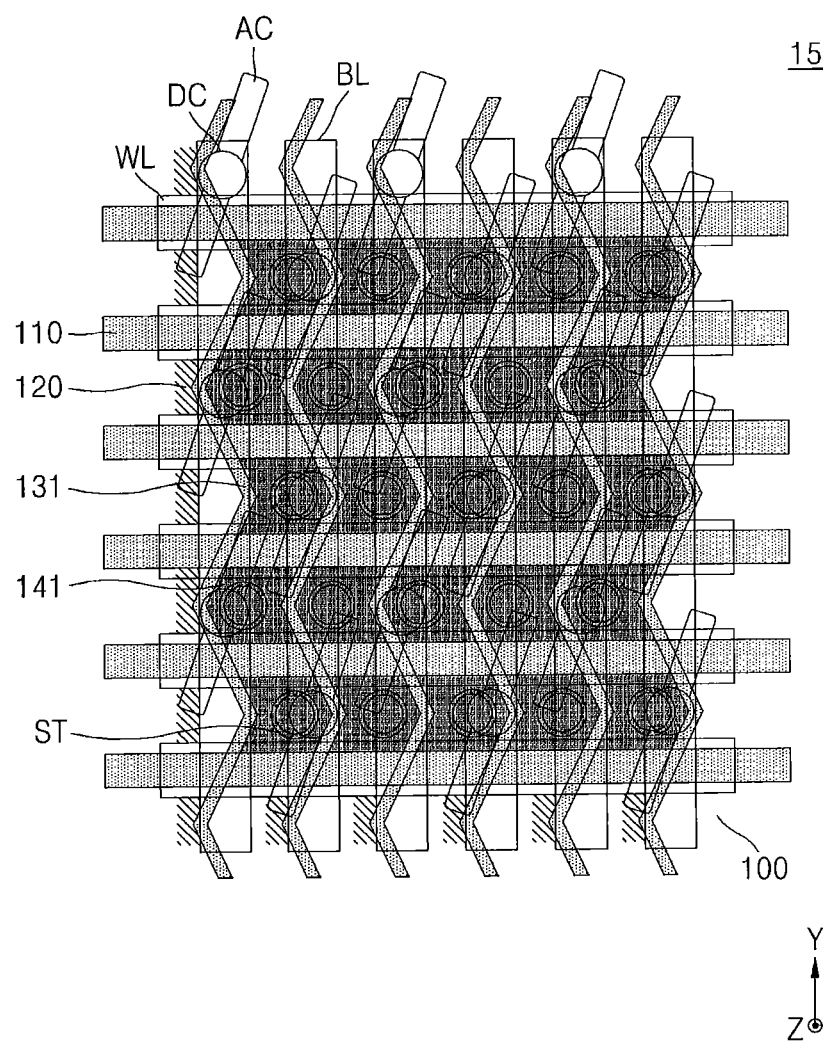

FIG. 1B is a schematic layout of a cell array area of a semiconductor device 15 according to another embodiment of the inventive concept. In FIG. 1B, the same reference numerals as FIG. 1A denote the same elements as FIG. 1A. Thus, repeated explanations thereof will not be given.

Referring to FIG. 1B, the shapes of second insulating lines 131 and the shapes of second contact structures 141 are different from those of the semiconductor device 10 described with reference to FIG. 1A.

The plurality of second insulating lines 131 are formed on the first contact structures 120 and the bit line structures BL and extend parallel to one another with a wave structure in the fourth direction that is different from the second direction and the third direction. Although the fourth direction is the Y-axis direction in FIG. 1B, the inventive concept is not limited thereto. In addition, although the second insulating lines 131 of FIG. 1B each have a wave structure or a zigzag structure, the inventive concept is not limited thereto. For example, the second insulating lines 131 of the semiconductor device 15 may have any shape having a periodic structure.

The second insulating lines 131 cover upper surfaces and sidewalls of the bit line structures BL and portions of upper surfaces of the first contact structures 120, and contact sidewalls of the first insulating lines 110. The second insulating lines 131 extend without bisecting the upper surfaces of the first contact structures 120. Accordingly, only the upper surface of one first contact structure 120 formed in an area defined by a pair of adjacent bit line structures BL and a pair of adjacent first insulating lines 110 is exposed in an area defined by a pair of adjacent first insulating lines 110 and a pair of adjacent second insulating lines 131.

The plurality of second contact structures 141 are formed in an area defined by the second insulating lines 131 and the first insulating lines 110. Because the second insulating lines 131 of the semiconductor device 15 each have a wave structure or a zigzag structure, each of the upper surfaces of the second contact structures 141, which is defined by the second insulating lines 131, may have a bent rectangular shape or a bent parallelogram shape. One of the second contact structures 141 is disposed to be connected to one of the first contact structures 120 corresponding thereto. The second contact structures 141 are electrically connected to the active regions AC via the first contact structures 120. In some embodiments, each of the first contact structures 120 may have a horizontal cross-sectional area of a first size, and each of the second contact structures 141 may have a horizontal cross-sectional area of a second size that is larger than the first size. In some embodiments, the second contact structures 141 may be arranged at regular intervals along sidewalls of the first insulating lines 110 and may also be arranged at regular intervals along sidewalls of the second insulating lines 131.

In some embodiments, an insulating pattern (not shown), which defines a storage node hole for exposing a part of the upper surface or the entire surface of each of the second contact structures 141, may be formed on the upper surface of each of the first insulating lines 110, the upper surface of each of the second insulating lines 131, and the upper surface of each of the second contact structures 141. One storage node hole is formed so that only the upper surface of one of the second contact structures 141 corresponding thereto is exposed. The upper surfaces of the second contact structures 141, each of which is exposed in the storage node hole, may be connected to the lower electrodes ST of the capacitors. The lower electrodes ST of the capacitors are electrically connected to the first contact structures 120 and the active regions AC via the second contact structures 141.

In this manner, because the second contact structures 141, which are defined by the second insulating lines 131 each having a periodic structure, may make improved or maximum contact with the first contact structures 120 and the lower capacitor electrodes ST, misalignment and contact failure may be greatly improved.

Figure 1C:
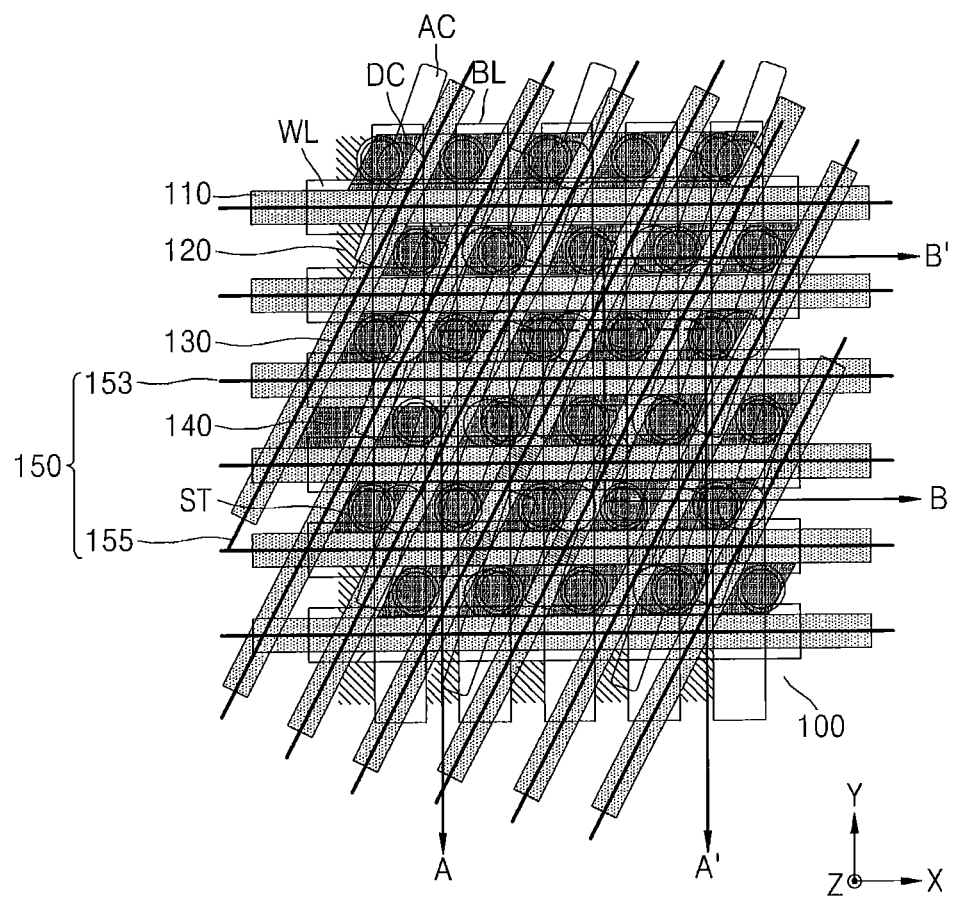

FIG. 1C is a schematic layout of a cell array area of a semiconductor device 20 according to another embodiment of the inventive concept. FIG. 1C illustrates a configuration in which some elements are added to the semiconductor device 10 of FIG. 1A to form a capacitor.

Referring to FIG. 1C, an insulating pattern 150, which exposes a part of the upper surface or the entire upper surface of each of the second contact structures 140, may be formed on the upper surface of each of the first insulating lines 110, the upper surface of each of the second insulating lines 130, and the upper surface of each of the second contact structures 140. The insulating pattern 150 may include a plurality of third insulating lines 153 that contact the upper surfaces of the first insulating lines 110 and extend in a fifth direction, and a plurality of fourth insulating lines 155 that contact the upper surfaces of the second insulating lines 130 and extend in a sixth direction. An area, which is defined by a pair of adjacent third insulating lines 153 and a pair of adjacent fourth insulating lines 155, is formed so that only the upper surface of one of the second contact structures 140 corresponding thereto is exposed.

In some embodiments, the fifth direction may be the same as the third direction, and the sixth direction may be the same as the fourth direction. In other words, the insulating pattern 150, which includes the third insulating lines 153 and the fourth insulating lines 155, may be formed to overlap with the first insulating lines 110 and the second insulating lines 130.

In some embodiments, constituent materials of the third insulating lines 153 may be different from those of the fourth insulating lines 155.

In some embodiments, a second horizontal cross-sectional area that is defined by the third insulating lines 153 and the fourth insulating lines 155 may be larger than a first horizontal cross-sectional area that is defined by the first insulating lines 110 and the second insulating lines 130.

Upper surfaces of the second contact structures 140, which are exposed by the insulating pattern 150, which includes the third insulating lines 153 and the fourth insulating lines 155, may be connected to the lower capacitor electrodes ST. An area defined by the insulating pattern 150 may have a round, oval, or parallelogram shape.

In this manner, because the semiconductor device 20 includes the insulating pattern 150, which includes the third and fourth insulating lines 153 and 155 corresponding to the first and second insulating lines 110 and 130, respectively, the second contact structures 140 may make improved or maximum contact with the lower capacitor electrodes ST, and thus, misalignment and contact failure may be greatly improved.

Figure 2:
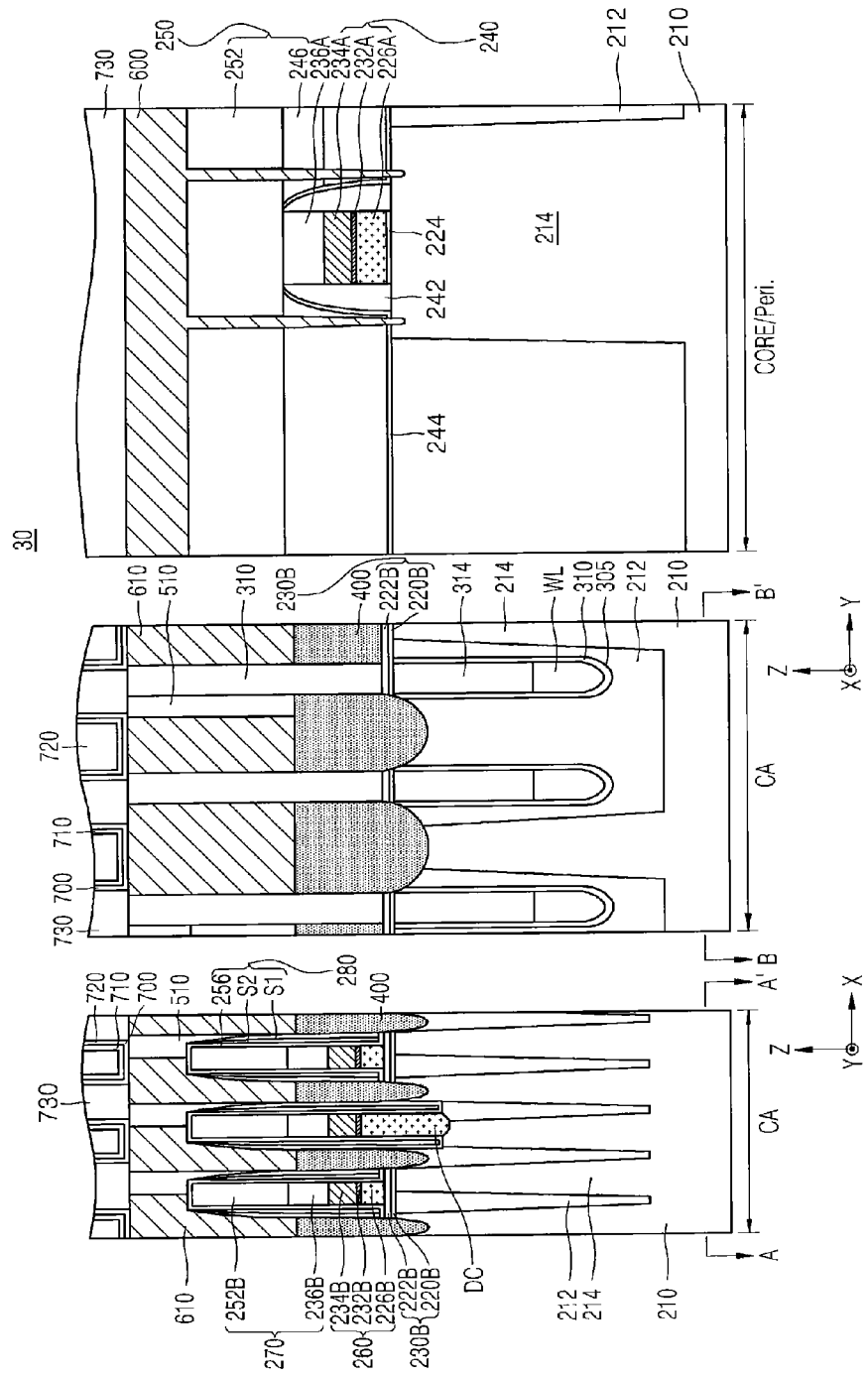
FIG. 2 is a cross-sectional view of a main part of a semiconductor device according to an embodiment of the inventive concept.

FIG. 2 is a cross-sectional view of a main part of a semiconductor device 30 according to an embodiment of the inventive concept. A part denoted by "CA" is a cross-sectional view of a cell array area of the semiconductor device 30, that is, a portion corresponding to an A-A' line cross-section and a B-B' line cross-section of FIG. 1A, and a part denoted by "CORE/Peri" is a cross-sectional view of a core/peripheral area of the semiconductor device 30.

Referring to FIG. 2, the semiconductor device 30 includes a substrate 210 including a plurality of active regions 214, which are defined by a device isolation layer 212, in the cell array area CA and the core/peripheral area CORE/Peri.

In some embodiments, the substrate 210 may be a semiconductor wafer. In some embodiments, the substrate 210 includes silicon (Si). In some other embodiments, the substrate 210 may include a semiconductor element, such as germanium (Ge), or a compound semiconductor, such as a silicon carbide (SiC), gallium arsenide (GaAs), indium arsenide (InAs), or indium phosphide (InP). In some embodiments, the substrate 210 may have a silicon on insulator (SOI) structure. For example, the substrate 210 may include a buried oxide (BOX) layer. In some embodiments, the substrate 210 may include a conductive area, for example, a well doped with impurities or a structure doped with impurities. Also, the substrate 200 may have various device isolation structures such as a shallow trench isolation (STI) structure.

Various kinds of individual devices may be formed on the substrate 210. The individual devices may include various microelectronic devices, such as a metal-oxide-semiconductor field effect transistor (MOSFET), a system large scale integration (LSI) circuit, an image sensor such as a CMOS imaging sensor (CIS), a micro-electro-mechanical system (MEMS), an active device, and a passive device. The individual devices may be electrically connected to the active regions 214 of the substrate 210. Also, the individual devices each may be electrically isolated from another adjacent individual device by an insulating layer.

In some embodiments, the device isolation layer 212 may be formed of oxide, nitride, or a combination thereof. However, the inventive concept is not limited thereto. The device isolation layer 212 may be a single layer including one kind of insulating layer or layers including a combination of at least two kinds of insulating layers.

An insulating pattern 230B is formed on the substrate 210, where the insulating pattern 230B has a plurality of holes that expose upper surfaces of direct contacts DC and define first contact structures 400. The insulating pattern 230B may include a first insulating pattern 220B and a second insulating pattern 222B. In some embodiments, the first insulating pattern 220B may be an oxide layer and the second insulating pattern 222B may be a nitride layer. However, the inventive concept is not limited thereto. The direct contacts DC each may be formed of single crystal silicon, single crystal germanium, single crystal silicon-germanium, polycrystalline semiconductor doped with impurities, metal (such as aluminum, copper, and tungsten), metal nitride, or a combination thereof. However, the inventive concept is not limited thereto.

Referring to the A-A' line cross-section of FIG. 2, a plurality of bit lines 260 are formed on the substrate 210 and extend parallel to one another in a first direction. In FIG. 2, as an example, the bit lines 260 are formed to extend in the Y-axis direction. The bit lines 260 may include a first conductive pattern 226B, a third conductive pattern 232B, and a fourth conductive pattern 234B. The bit lines 260 may be connected to the active regions 214 of the substrate 210 via the direct contacts DC. In some embodiments, the third conductive pattern 232B and the fourth conductive pattern 234B each may be formed of titanium nitride (TiN), titanium silicon nitride (TiSiN), tungsten (W), tungsten silicide (WSi2), or a combination thereof. However, the inventive concept is not limited thereto. In some embodiments, the third conductive pattern 232B may include TiSiN, and the fourth conductive pattern 234B may include W.

A capping structure 270 may be formed on the bit lines 260. The capping structure 270 may include a capping layer 236B and an insulating layer 252B. The capping layer 236B may be a silicon nitride layer.

A stacked structure, which includes the bit lines 260 and the capping structure 270, may be covered with a spacer 280. The spacer 280 may be formed at a sidewall of the stacked structure and may cover an upper surface of the stacked structure. The spacer 280 may include an insulating liner 256 and insulating spacers S1 and S2. The insulating liner 256 may cover upper surfaces and sidewalls of the bit lines 260, and the insulating spacers S1 and S2 may cover the sidewalls of the bit lines 260. In some embodiments, the insulating liner 256 and the insulating spacers S1 and S2 may be formed of silicon oxide, silicon nitride, air, or a combination thereof. Although a case in which the insulating spacers S1 and S2 include a double layer is illustrated in FIG. 2, the inventive concept is not limited thereto. For example, the insulating spacers S1 and S2 each may include a single layer or a triple layer.

The first contact structure 400, which is connected to the active regions 214, is formed in an area defined by a pair of adjacent bit lines 260 and an area defined by a pair of adjacent first insulating lines 310. The first insulating lines 310 are not shown in the A-A' line cross-section, but are shown in the B-B' line cross-section. In some embodiments, the first contact structure 400 may have a lower surface than the level of a main surface of the substrate 210. Although in FIG. 2 the levels of the upper surfaces of the bit lines 260 are higher than the level of the upper surface of the first contact structure 400, the inventive concept is not limited thereto. In some other embodiments, the levels of the upper surfaces of the bit lines 260 may be approximately the same as that of the upper surface of the first contact structure 400.

The first contact structure 400 is formed of a conductive material. In some embodiments, the first contact structure 400 may be an epitaxial layer. For example, the first contact structure 400 may be formed of single crystal silicon, single crystal germanium, or single crystal silicon-germanium. In some embodiments, the first contact structure 400 may include a polycrystalline semiconductor layer doped with impurities. For example, the first contact structure 400 may include a polysilicon layer doped with impurities. In some embodiments, the first contact structure 400 may include a metal. For example, the first contact structure 400 may include aluminum, copper, or tungsten. In some embodiments, a metal silicide layer may be formed on the surfaces of the active regions 214 that contact the first contact structure 400. The metal silicide layer may include cobalt silicide.

Referring to the B-B' line cross-section of FIG. 2, a plurality of buried word lines WL are formed in the substrate 210 and extend parallel to one another in a second direction that is different from the first direction. In FIG. 2, the word lines WL are formed to extend in the X-axis direction. The substrate 210 includes a plurality of word line trenches 305 formed in the substrate 210, a gate dielectric layer 310 covering bottoms and inside walls of the word line trenches 305, the word lines WL filled in lower portions of the word line trenches 305 covered with the gate dielectric layer 310, and a buried insulating layer 314 that covers upper surfaces of the word lines WL and fills the word line trenches 305. In some embodiments, an upper surface of the buried insulating layer 314 may be at the same level as an upper surface of the substrate 210.

The insulating pattern 230B, in which the holes defining the first contact structure 400 and the holes defining the direct contact DC are formed, is formed on the substrate 210.

A plurality of first insulating lines 310 are formed on the insulating pattern 230B and extend parallel to one another in a third direction that is different from the first direction. In FIG. 2, as an example, the first insulating lines 310 are formed to extend in the X-axis direction. Levels of upper surfaces of the first insulating lines 310 are higher than those of upper surfaces of the bit lines 260. In some embodiments, the third direction is the same as the first direction, and thus, the first insulating lines 310 may be formed to be overlapped on the word lines WL. In some embodiments, the first insulating lines 310 may be formed of oxide, nitride, carbide, polymer, or a combination thereof. However, the inventive concept is not limited thereto. In some embodiments, the first insulating lines 310 each may have a fence shape.

The first contact structure 400, which is filled with a conductive material and thus is connected to the active regions 214, is formed in an area defined by a pair of adjacent first insulating lines 310 and a pair of adjacent bit lines 260. The bit lines 260 are not shown in the B-B' line cross-section, but are shown in the A-A' line cross-section. In some embodiments, the first contact structure 400 may have a lower surface than the level of a main surface of the substrate 210.

A plurality of second insulating lines 510 cover portions of the upper surfaces of the bit lines 260, the sidewalls of the bit lines 260, and a portion of the upper surface of the first contact structure 400, and extend parallel to one another in a fourth direction, which is different from the third direction, while contacting portions of the sidewalls of the first insulating lines 310. In FIG. 2, as an example, the second insulating lines 510 are formed to extend between the X-axis direction and the Y-axis direction. Referring to the A-A' line cross-section, the second insulating lines 510 contact the upper surfaces and sidewalls of the bit lines 260 and contact a portion of the upper surface of the first contact structure 400. Referring to the B-B' line cross-section, the second insulating lines 510 contact portions of the sidewalls of the first insulating lines 310 and contact a portion of the upper surface of the first contact structure 400. The level of the upper surface of the first contact structure 400 may be lower than that of an upper surface of the first insulating line 310.

In some embodiments, the levels of upper surfaces of the second insulating lines 510 may be approximately equal to those of the upper surfaces of the first insulating lines 310. In some embodiments, the first insulating lines 310, the second insulating lines 510, and the spacer 280 may be formed of the same material.

A second contact structure 610, which is filled with a conductive material and, thus, is connected to the upper surface of the first contact structure 400, is formed in an area defined by a pair of adjacent first insulating lines 310 and a pair of adjacent second insulating lines 510. In some embodiments, the second contact structure 610 may be formed of titanium nitride, titanium silicon nitride, tungsten, tungsten silicide, or a combination thereof. However, the inventive concept is not limited thereto. In some embodiments, the second contact structure 610 may be formed of the same material as the first contact structure 400. In some embodiments, the levels of the upper surfaces of the first insulating lines 310, the levels of the upper surfaces of the second insulating lines 510, and the level of the upper surface of the second contact structure 610 may all be the same.

In some embodiments, an insulating pattern 730 may be formed on the upper surfaces of the first insulating lines 310, the upper surfaces of the second insulating lines 510, and the upper surface of the second contact structure 610, wherein the insulating pattern 730 defines a storage node hole that exposes the upper surface of the second contact structure 610. A capacitor is formed in the storage node hole. The capacitor includes a lower electrode 700, a dielectric layer 710, and an upper electrode 720. In some embodiments, the insulating pattern 730 may be formed of oxide, nitride, carbide, polymer, or a combination thereof. However, the inventive concept is not limited thereto.

A horizontal cross-sectional view of the semiconductor device 30 will be described below with reference back to FIG. 1A. The same reference names described with reference to FIG. 1A and FIG. 2 denote the same elements although reference numerals differ.

Referring back to FIG. 1A, the semiconductor device 30 includes bit line structures BL in the first direction (the Y-axis direction), first insulating lines 110 in the second direction (the X-axis direction), a first contact structure 120 formed to fill an area defined by the bit line structures BL and the first insulating lines 110, second insulating lines 130 in the third direction (a direction between the X-axis direction and the Y-axis direction) on the first contact structure 120 and the bit line structures BL, a second contact structure 140 formed to fill an area defined by the first insulating lines 110 and the second insulating lines 130, and a lower capacitor electrode ST formed on the second contact structure 140. Although in FIG. 1A, the first direction is the X-axis direction, the second direction is the Y-axis direction, and the third direction is a direction between the X-axis direction and the Y-axis direction, the inventive concept is not limited thereto.

Referring to the cross-section of the core/peripheral area CORE/Peri., a gate structure is formed on the substrate 210 including the active regions 214 defined by the device isolation layer 212. In detail, a gate electrode 240 for a peripheral circuit, which includes a first conductive pattern 226A, a third conductive pattern 232A, and a fourth conductive pattern 234A, is formed on a gate dielectric layer 224 formed on the substrate 210, and the upper surface of the gate electrode 240 is covered with a capping pattern 236A. Both sidewalls of a gate structure in which the gate dielectric layer 224, the gate electrode 240, and the capping pattern 236A are stacked are covered with an insulating spacer 242. An insulating thin film 244 and an insulating layer 250 are formed on the whole surface of the core/peripheral area CORE/Peri. to cover the gate structure and the insulating spacer 242. The insulating layer 250 may include an interlayer insulating layer 246 and an insulating layer 252. A conductive layer 600 is formed separate from the substrate 210 with the insulating layer 250 placed therebetween. The conductive layer 600 may include contact plugs that penetrate the insulating layer 250 and the insulating liner insulating thin film 256 and thus are connected to the active regions 214. In some embodiments, the insulating spacer 242 may be formed of oxide, nitride, or a combination thereof, and the insulating thin film 244 may be formed of nitride. However, the inventive concept is not limited thereto. In some embodiments, the interlayer insulating layer 246 may be a silicon oxide layer formed by a high density plasma (HDP) or flowable chemical vapor deposition (FCVD) method. However, the inventive concept is not limited thereto.

FIGS. 3 to 18B are cross-sectional views and layouts illustrated according to a process sequence of a method of manufacturing a semiconductor device, according to an embodiment of the inventive concept. A cell array area CA, a core/peripheral area CORE/Peri., a line A-A', and a line B-B', illustrated in FIGS. 3 to 18B, are the same as those illustrated in FIG. 2. In FIGS. 3 to 18B, the same reference numerals denote the same elements. Thus, repeated explanations thereof will not be given.

Figure 3:
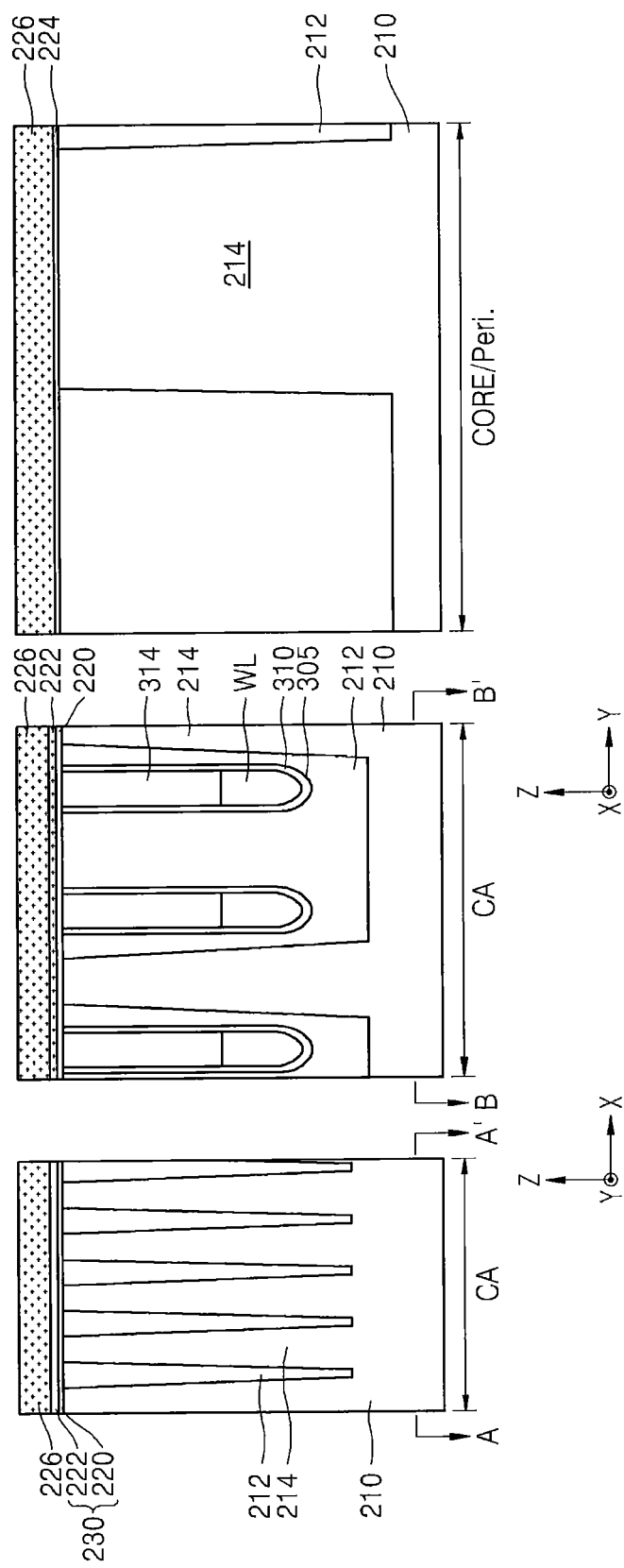
FIGS. 3 to 18B are cross-sectional views and layouts, illustrated according to a process sequence of a method of manufacturing a semiconductor device, according to an embodiment of the inventive concept.

Referring to FIG. 3, a device isolation layer 212 is formed in a substrate 210 to define a plurality of active regions 214 in the cell array area CA and the core/peripheral area CORE/Peri.

Referring to the B-B' line cross-section of the cell array area CA, a plurality of word line trenches 305 are formed in the substrate 210. The plurality of word line trenches 305 may extend parallel to one another in the X-axis direction, and each of the word line trenches 305 may have a line shape intersecting the plurality of active regions 214. A gate dielectric layer 310 is formed to cover lower surfaces and sidewalls of the word line trenches 305, and a word line WL and a buried insulating layer 314 are sequentially formed in each of the word line trenches 305. Upper surfaces of the plurality of buried insulating layers 314 may be about at the same level as an upper surface of the substrate 210. In some embodiments, after forming the word lines WL, impurity ions may be implanted in the substrate 210 at both sides of each of the word lines WL to form source and drain areas in upper surfaces of the active areas 214. In some embodiments, before forming the word lines WL, an impurity ion implantation process may be performed to form source and drain areas. The A-A' line cross-section of the cell array area CA is an area between the word lines WL, and thus the word lines WL are not shown in the A-A' line cross-section of the cell array area CA.

After sequentially forming a first insulating layer 220 and a second insulating layer 222 on the substrate 210 in both the cell array area CA and the core/peripheral area CORE/Peri., the first insulating layer 220 and the second insulating layer 222 are removed from the core/peripheral area CORE/Peri. to expose an active region 214 of the core/peripheral area CORE/Peri. again. Next, the cell array area CA is covered with a mask pattern (not shown), and then a gate dielectric layer 224 is formed on the substrate 210 of the core/peripheral area CORE/Peri. In some embodiments, the first insulating layer 220 may be an oxide layer, and the second insulating layer 222 may be a nitride layer. However, the inventive concept is not limited thereto. In some embodiments, the gate dielectric layer 224 may include one or more of a silicon oxide layer, a silicon nitride layer, a silicon oxynitride layer, an oxide/nitride/oxide (ONO) layer, and a high-k dielectric film having a dielectric constant that is higher than that of the silicon oxide layer.

In the cell array area CA and the core/peripheral area CORE/Peri., a first conductive layer 226 is formed on the second insulating layer 222 and the gate dielectric layer 224. In some embodiments, the first conductive layer 226 may be formed of doped polysilicon. However, the inventive concept is not limited thereto.

Figure 4:
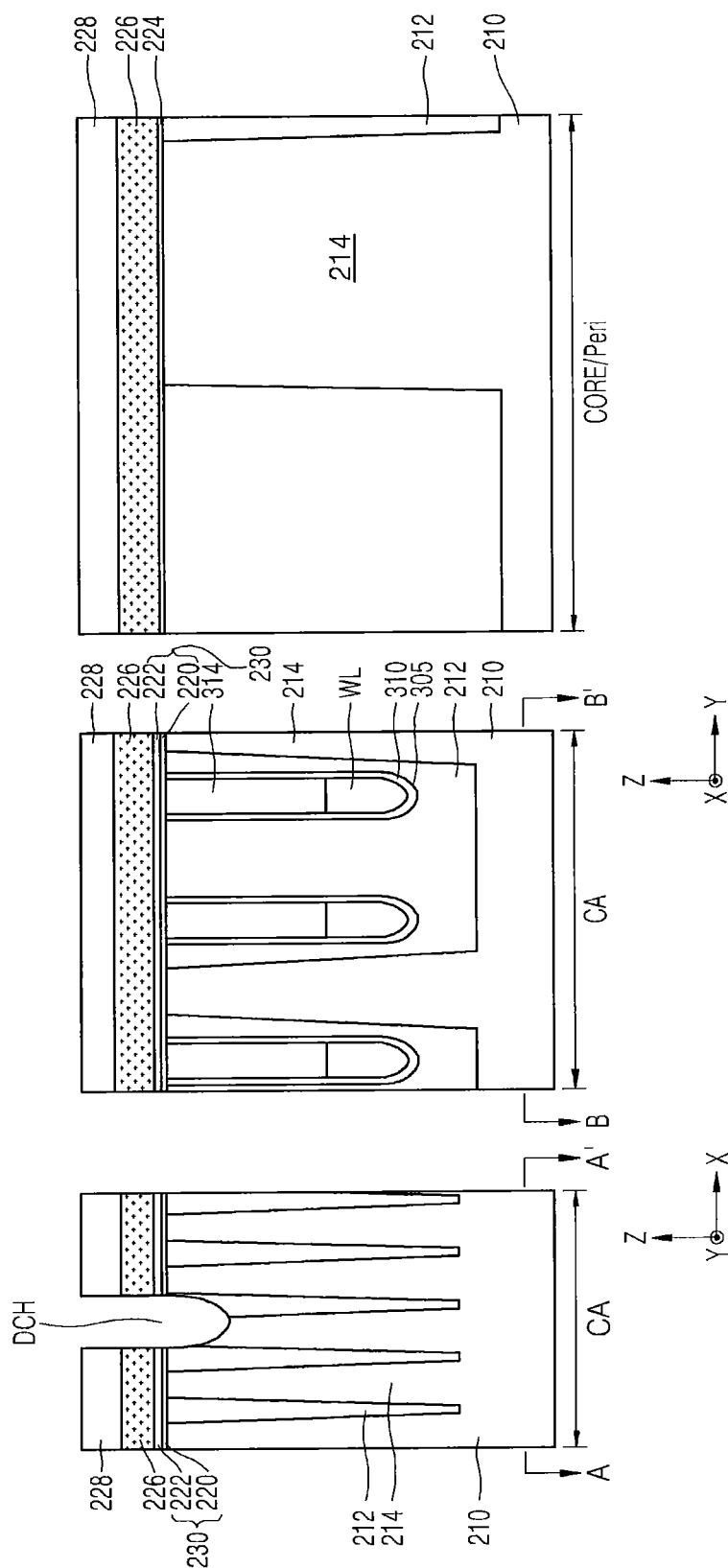

Referring to FIG. 4, a mask pattern 228 is formed on the first conductive layer 226 in both the cell array area CA and the core/peripheral area CORE/Peri. Referring to the A-A' line cross-section of the cell array area CA, the mask pattern 228 has an opening that exposes a portion of the first conductive layer 226. Next, the first conductive layer 226 exposed via the opening of the mask pattern 228 is etched, and a portion of the substrate 210 and a portion of the device isolation layer 212, which are exposed as a result of the etching, are etched to thereby form a direct contact hole DCH that exposes an active region 214 of the substrate 210 in the cell array area CA. A photolithography process may be used to form the mask pattern 228. The core/peripheral area CORE/Peri. may be covered with the mask pattern 228 and, thus, may not be exposed to the outside.

Figure 5:
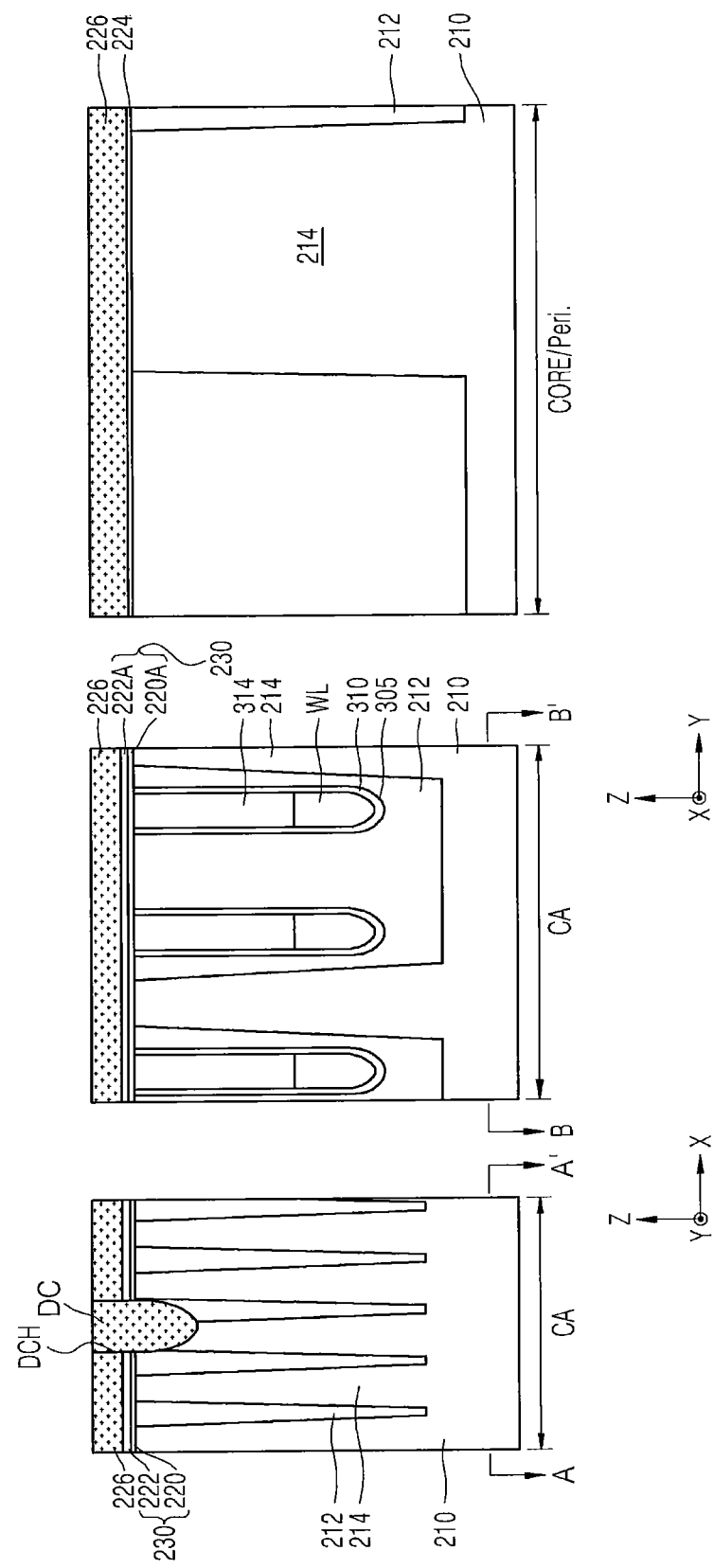

Referring to FIG. 5, a second conductive layer having a thickness that is sufficient for filling the direct contact hole DCH is formed in the direct contact hole DCH and on the first conductive layer 226 after removing the mask pattern 228 from the cell array area CA and the core/peripheral area CORE/Peri. Next, the second conductive layer is removed so that the second conductive layer remains only in the direct contact hole DCH, and thus, a direct contact DC formed of the second conductive layer remaining in the direct contact hole DCH is formed. The second conductive layer may be formed of doped polysilicon. However, the inventive concept is not limited thereto. When removing the second conductive layer, an etch back or chemical mechanical polishing (CMP) process may be used.

Figure 6:
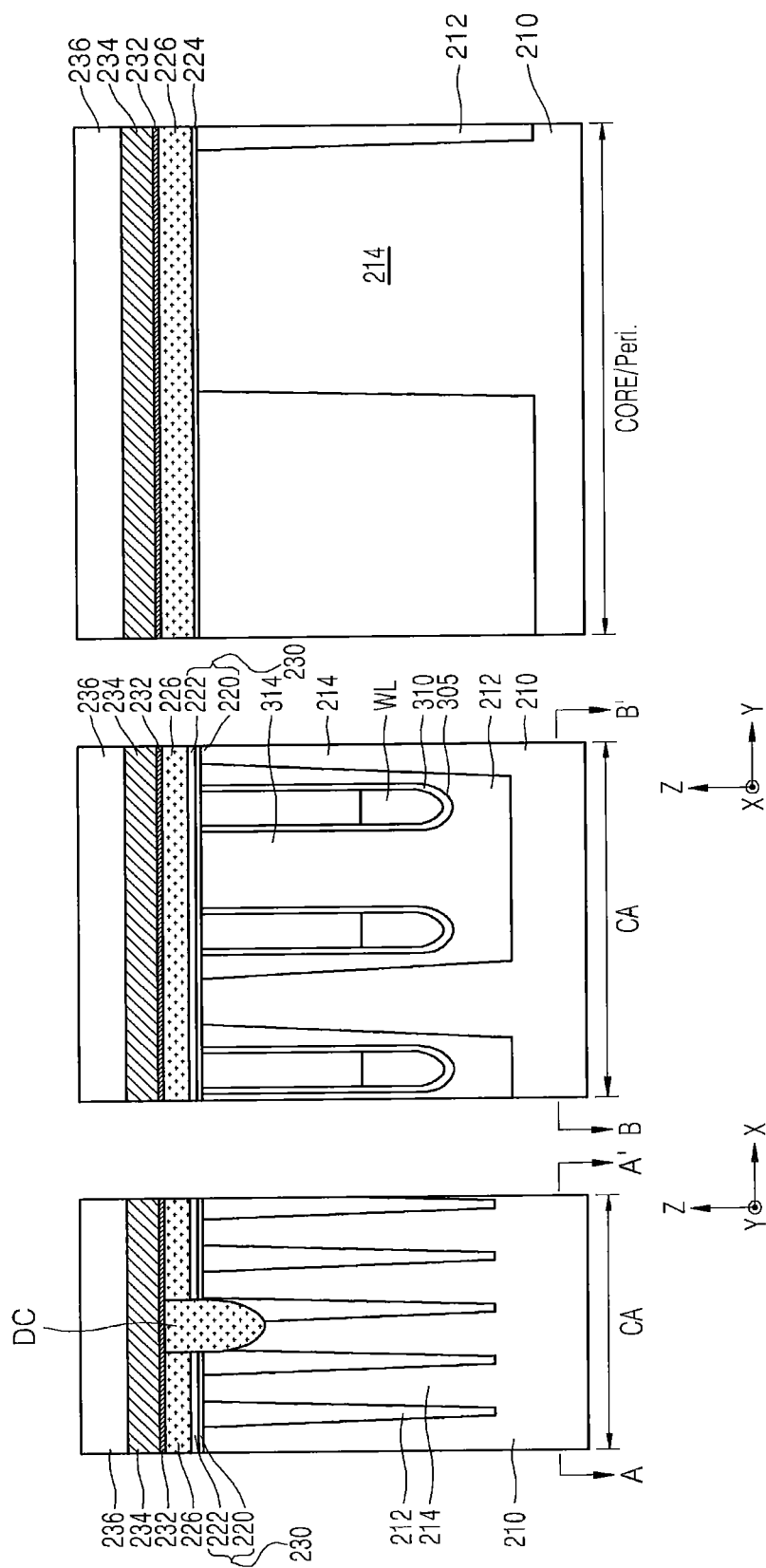

Referring to FIG. 6, a third conductive layer 232, a fourth conductive layer 234, and a capping layer 236 are sequentially formed on the first conductive layer 226 and the direct contact DC in both the cell array area CA and the core/peripheral area CORE/Peri.

Figure 7:
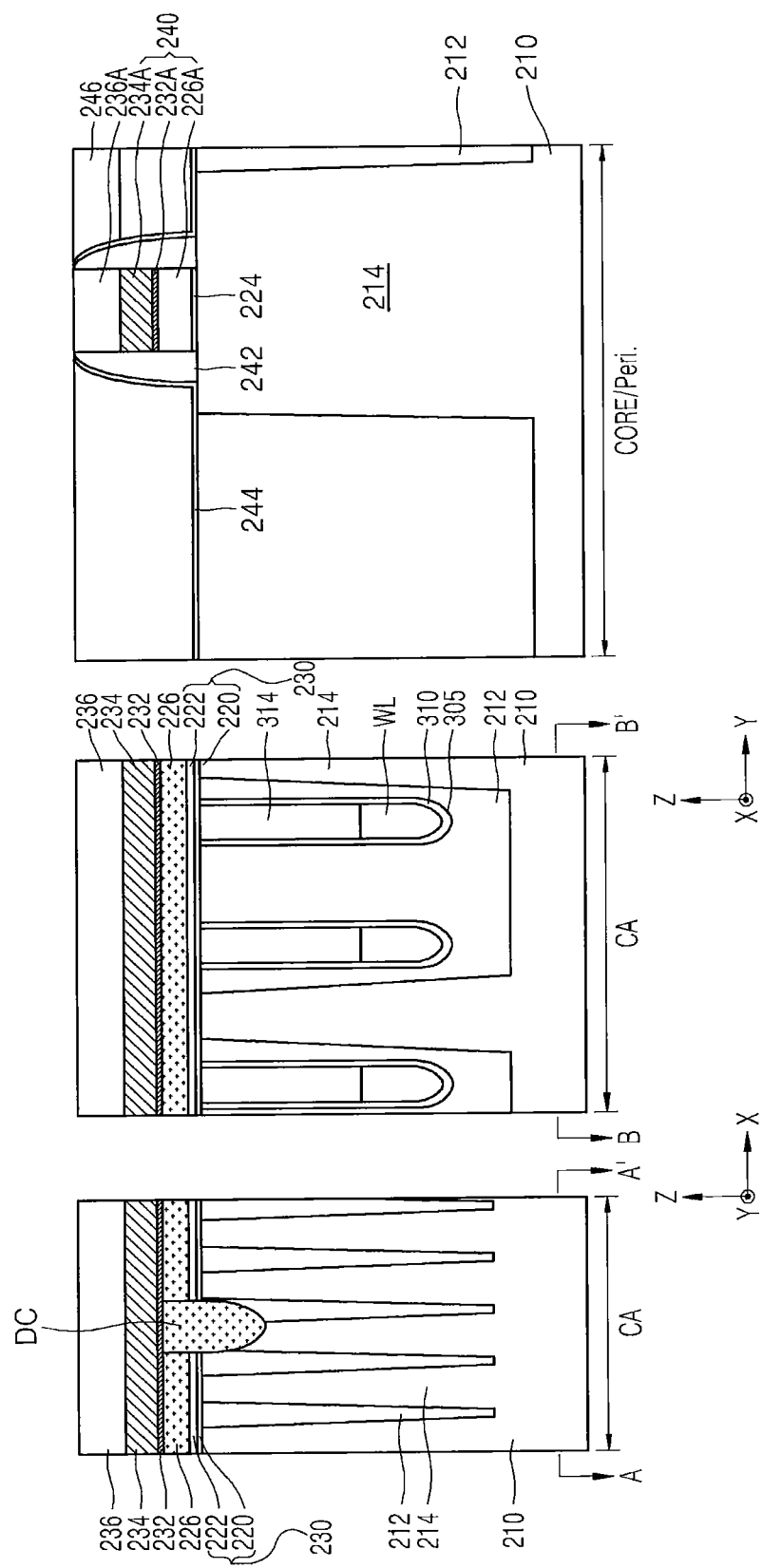

Referring to FIG. 7, the cell array area CA is covered with a mask pattern (not shown), and then in the core/peripheral area CORE/Peri., the gate dielectric layer 224, the first conductive layer 226, the third conductive layer 232, the fourth conductive layer 234, and the capping layer 236 are patterned by using a photolithography process. As a result, a gate electrode 240 for a peripheral circuit, which includes a first conductive pattern 226A, a third conductive pattern 232A, and a fourth conductive pattern 234A, is formed on the gate dielectric layer 224. The gate electrode 240 is covered with a capping pattern 236A. After forming an insulating spacer 242 at both sidewalls of a gate structure in which the gate dielectric layer 224, the gate electrode 240, and the capping pattern 236A are stacked, an insulating thin film 244 is formed on the whole surface of the core/peripheral area CORE/Peri. to cover the gate structure. Then, a planarized interlayer insulating layer 246 is formed that covers the gate structure and the insulating thin film 244. Although the insulating thin film 244 is not on the capping pattern 236A in FIG. 7, the inventive concept is not limited thereto and the insulating thin film 244 is initially formed on the capping pattern 236A during a process and then the insulating thin film 244 formed on the capping pattern 236A is removed.

Figure 8:
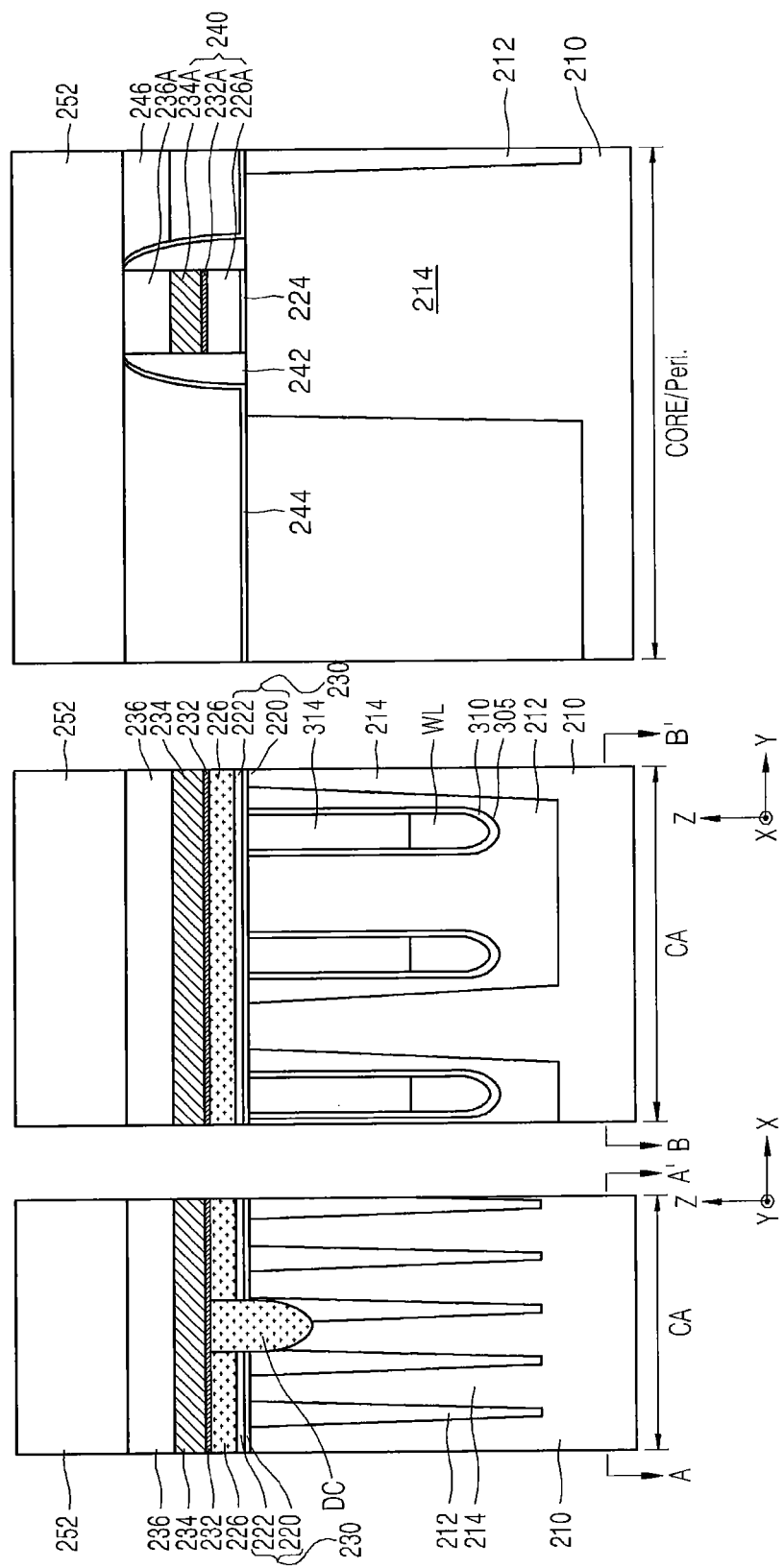

Referring to FIG. 8, an insulating layer 252 is formed on the capping layer 236 in both the cell array area CA and the core/peripheral area CORE/Peri.

Figure 9:
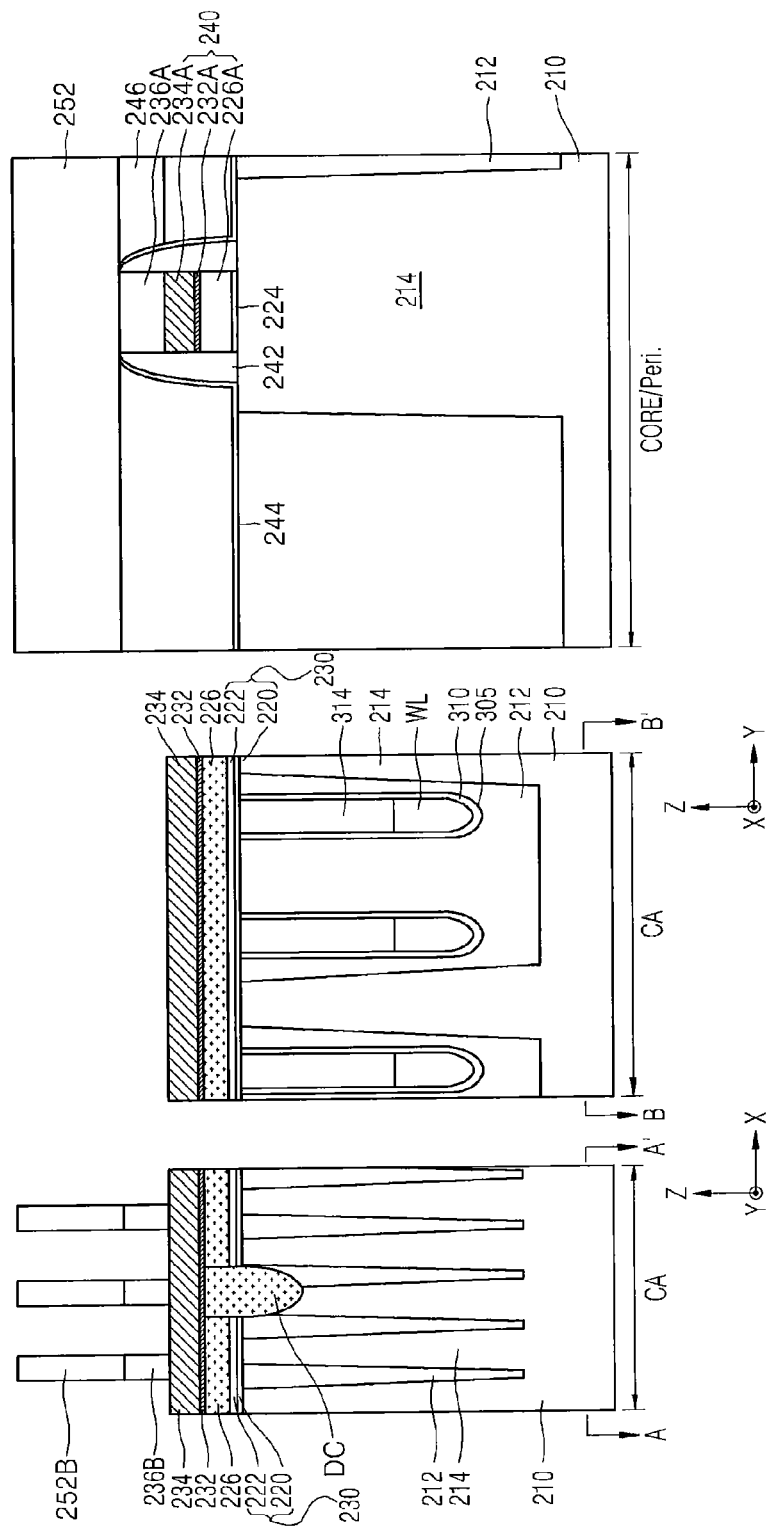

Referring to FIG. 9, the insulating layer 252 and the capping layer 236 of FIG. 8 are patterned by using a photolithography process. As a result, referring to the A-A' line cross-section, a cell mask pattern 252B and a capping pattern 236B, which are to be used as an etch mask to form a plurality of bit lines, are formed in the cell array area CA. Because the B-B' line cross-section is an area between bit lines, the insulating layer 252 and the capping layer 236 of FIG. 8 are not shown in the B-B' line cross-section. The insulating layer 252 is not removed in the core/peripheral area CORE/Peri.

Figure 10:
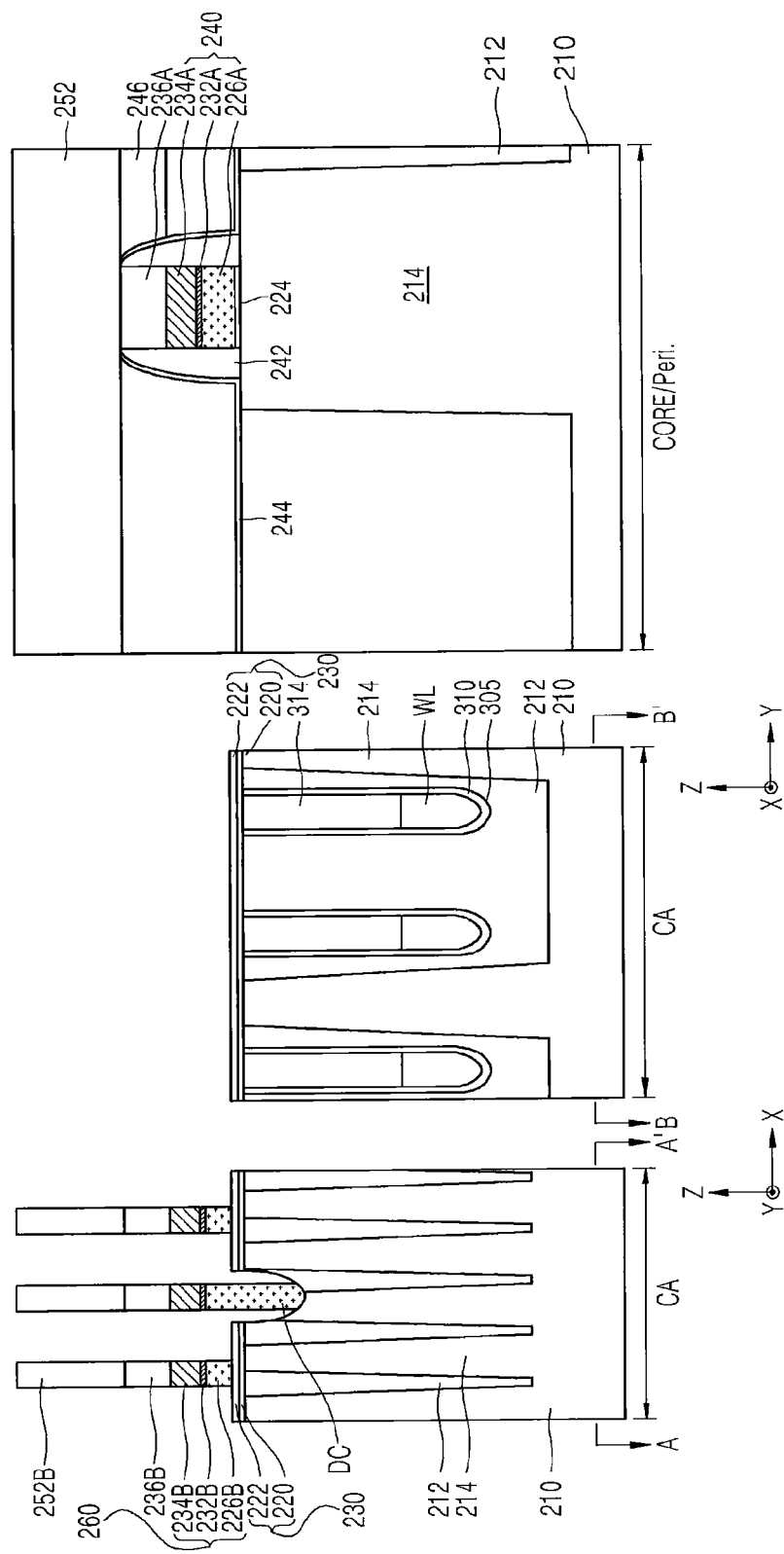

Referring to FIG. 10, a portion of a structure under the cell mask pattern 252B and the capping pattern 236B is etched by using the cell mask pattern 252B and the capping pattern 236B as an etch mask. As a result, referring to the A-A' line cross-section, the first conductive layer 226, the third conductive layer 232, and the fourth conductive layer 234 are partially etched, and thus, a plurality of bit lines 260, each of which includes a first conductive pattern 226B, a third conductive pattern 232B, and a fourth conductive pattern 234B and extends in the Y-axis direction, are formed. The plurality of bit lines 260 are connected to the active region 214 via the direct contacts DC. Because the B-B' line cross-section is an area between the bit lines, all the first conductive layer 226, the third conductive layer 232, and the fourth conductive layer 234 of FIG. 9 are not shown in the B-B' line cross-section.

In some embodiments, a process of forming a material layer of the gate electrode 240 for a peripheral circuit in the core/peripheral area CORE/Peri of FIG. 7 and a process of forming a material layer of the bit lines 260 in the cell array area CA of FIG. 8 may be performed by using only one photolithography process. In this case, an etch mask includes mask patterns for defining the gate electrode 240 and the bit lines 260.

Figure 11:
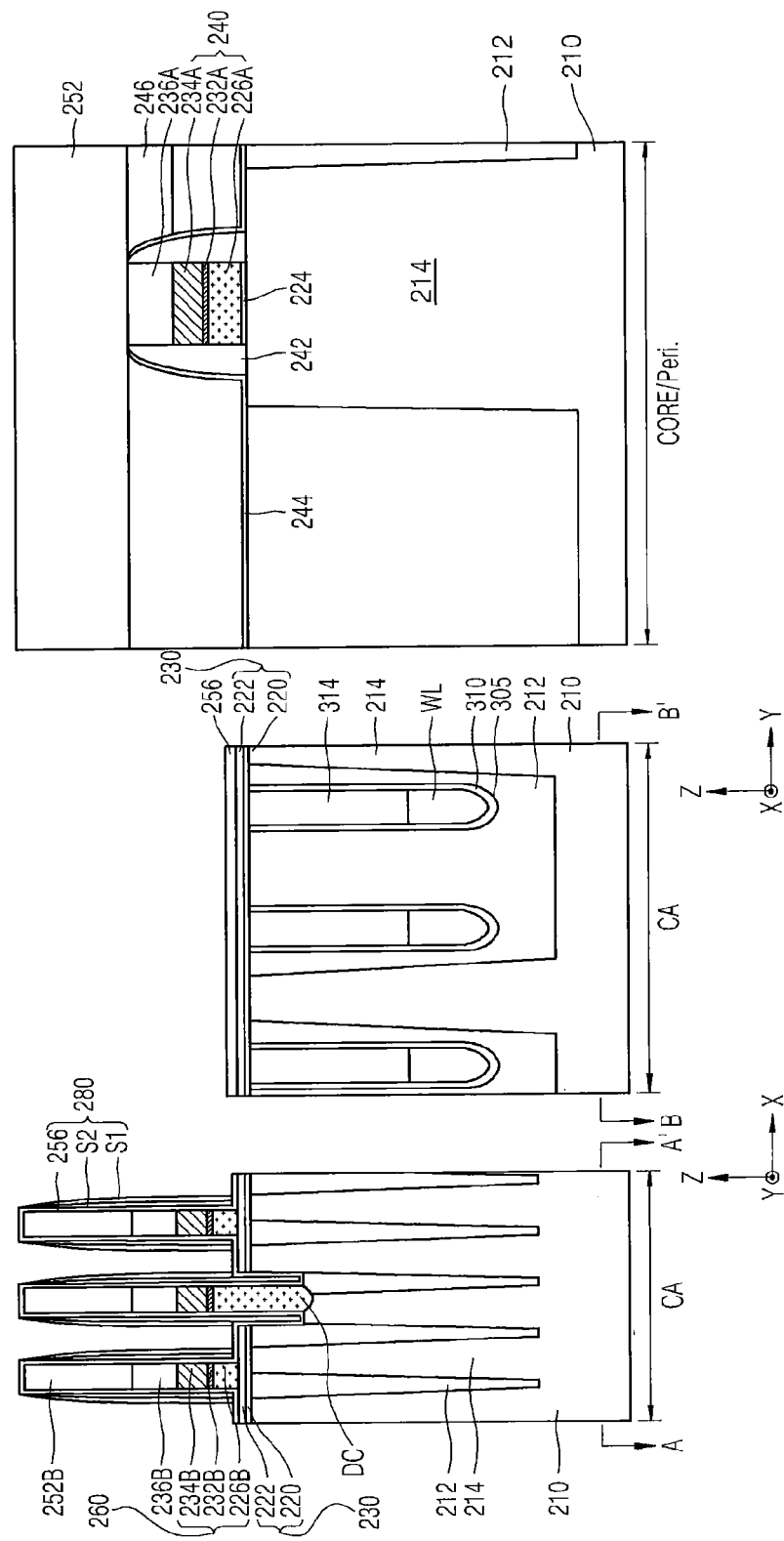

Referring to FIG. 11, an insulating liner 256 may be formed on an upper surface of a resultant structure in which the bit lines 260 of the cell array area CA were formed. Insulating spacers S1 and S2 may be formed at a sidewall of each of the bit lines 260 and cover the insulating liner 256.

Figure 12:
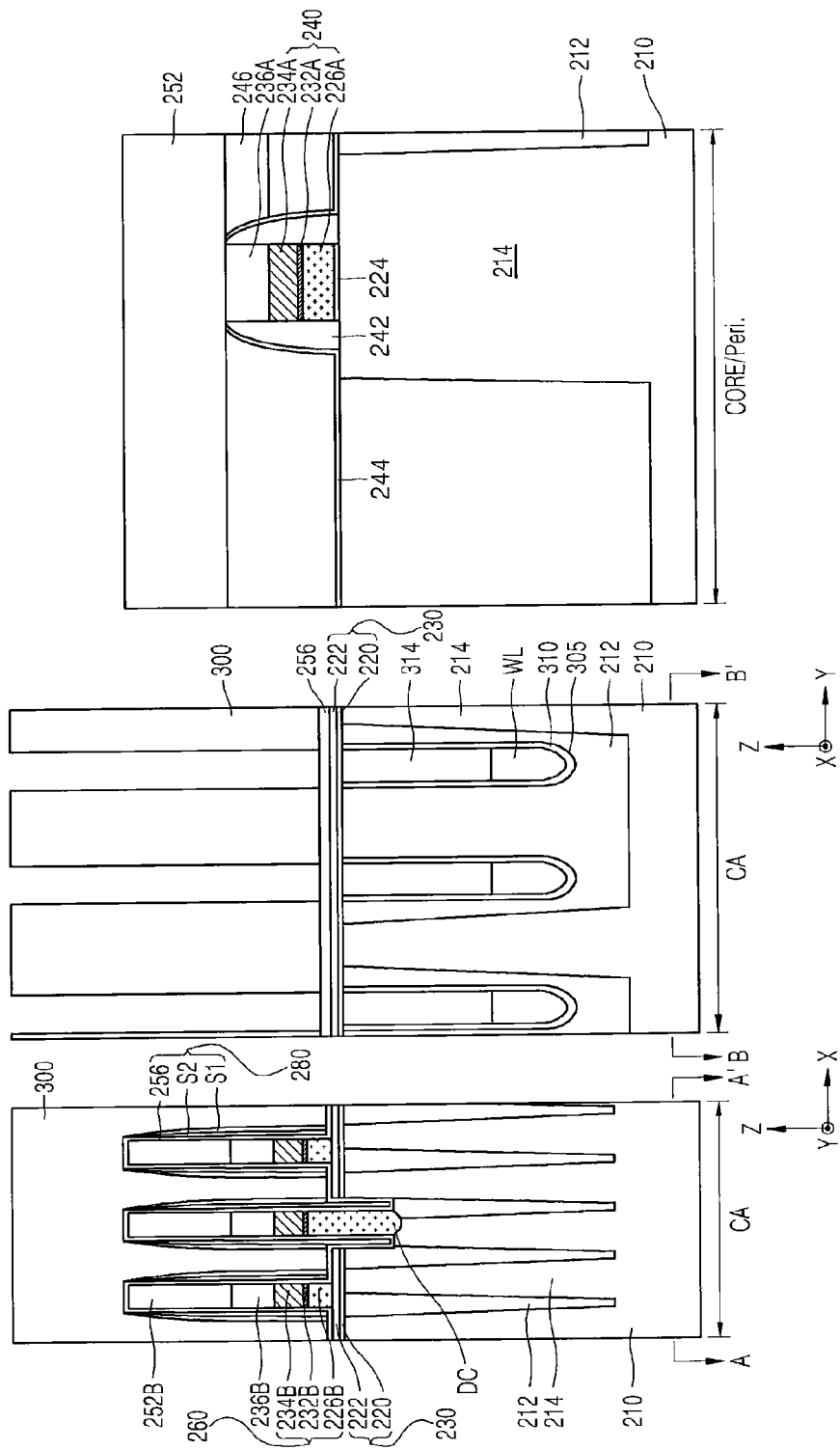

Referring to FIG. 12, an insulating material 300 is formed on the whole surface of a resultant structure formed in the cell array area CA of FIG. 11 so as to cover upper surfaces of the bit lines 260. A mask pattern (not shown) defining a first insulating line 310 is formed on the insulating material 300, and the insulating material 300 is etched by using the mask pattern as an etch mask.

In the core/peripheral area CORE/Peri., material layers that are required for forming the cell array area CA may be formed and then be removed. Accordingly, the material layers required for forming the cell array area CA are not illustrated in the core/peripheral area CORE/Peri. of FIGS. 12 to 15.

Figure 13A:
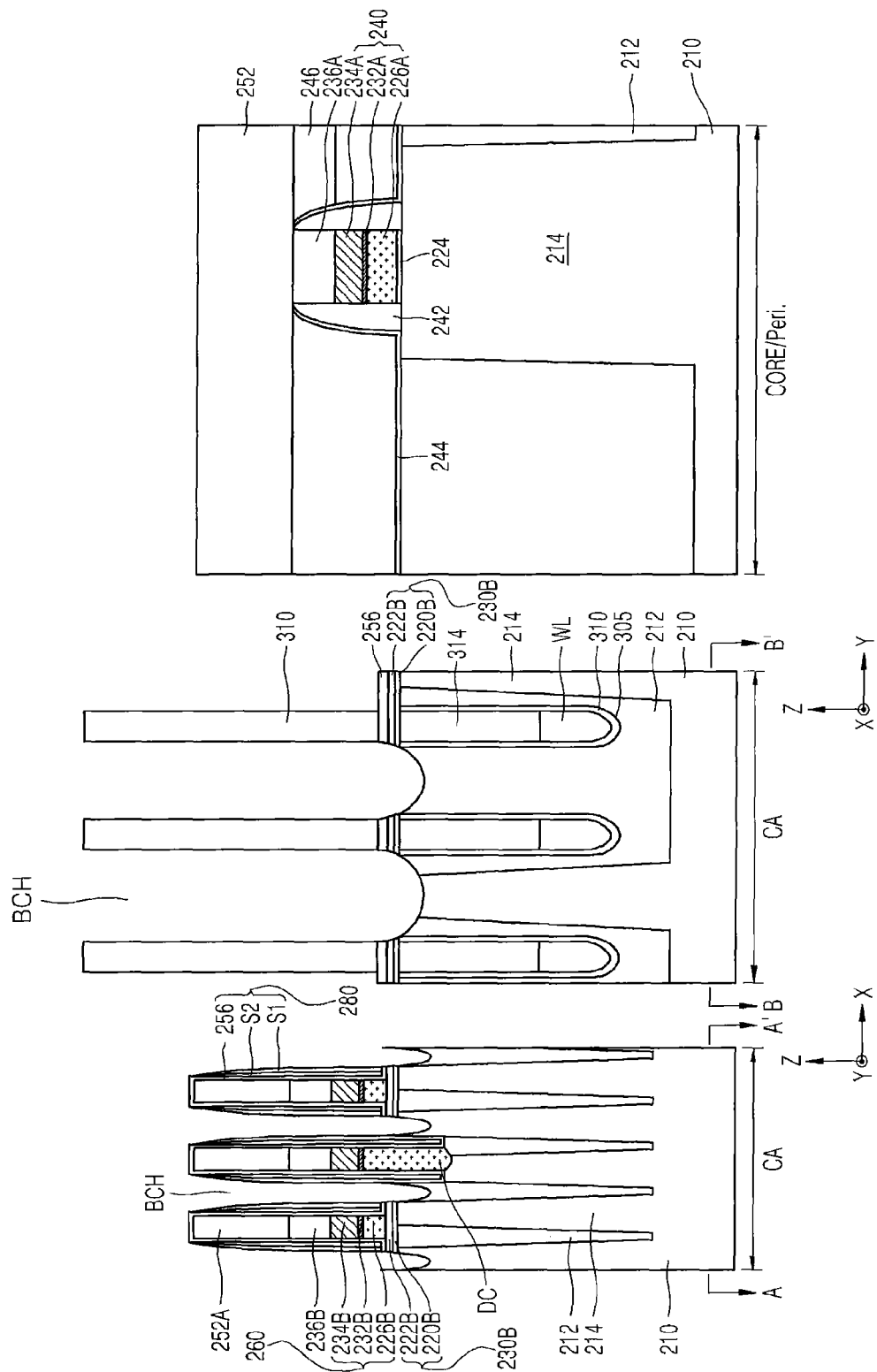

Referring to the A-A' line cross-section of FIG. 13A, an area in which the insulating material 300 in a resultant structure of the cell array area CA of FIG. 12 is etched is filled with a constituent material of the first insulating line 310 and the first insulating line 310 is formed by etching the insulating material 300. The insulating material 300 and the constituent material of the first insulating line 310 differ. In some embodiments, the first insulating line 310 may be formed of silicon oxide, silicon nitride, or a combination thereof. However, the inventive concept is not limited thereto. In some embodiments, the insulating material 300 may be removed by using a wet etching process.

The first insulating line 310 includes a plurality of insulating lines extending in the X-axis direction as shown in the B-B' line cross-section. In this case, areas, which are defined by the plurality of first insulating lines 310 and the bit lines 260 extending in the Y-axis direction as shown in the A-A' line cross-section, are formed. The areas are etched by using the first insulating lines 310 and the bit lines 260 as an etch mask so that an active region 214 under the area is exposed, and thus, holes BCH are formed. The first insulating lines 310 are not shown in the A-A' line cross-section.

Referring to the B-B' line cross-section, the B-B' line cross-section is an area between the bit lines 260, and the first insulating layer 220 and the second insulating layer 222 (refer to FIG. 12) under a plurality of holes BCH are removed so that the active region 214 is exposed. Thus, a first insulating pattern 220B and a second insulating pattern 222B are formed on the substrate 210 between the plurality of holes BCH, and the first insulating lines 310 extend in the X-axis direction. The bit lines 260 are not shown in the B-B' line cross-section.

Figure 13B:
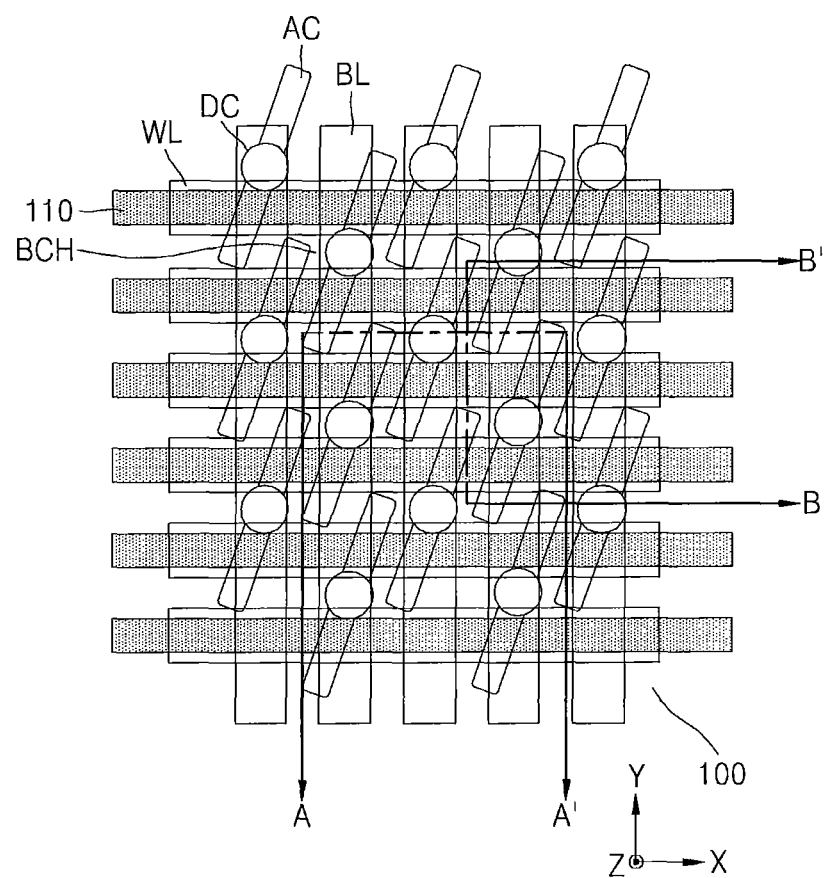

FIG. 13B is a schematic layout of the cell array area CA illustrated in FIG. 13A. The same reference names that are described with reference to FIG. 13A and FIG. 13B denote the same elements although reference numerals differ. A bit line structure BL of FIG. 13B is a structure in which the bit line 260 and the spacer 280 of FIG. 13A are combined with each other.

Referring to FIG. 13B, the semiconductor device 30 includes a plurality of word lines WL, a plurality of bit line structures BL, and a plurality of first insulating lines 110. The word lines WL extend in the X-direction while intersecting active regions AC of a substrate 100. The bit line structures BL are connected to the active regions AC via direct contacts DC while intersecting the active regions AC and extend in the Y-axis direction. The first insulating lines 110 extend in the X-axis direction. A bit line contact hole BCH is formed in an area that is defined by a pair of adjacent bit line structures BL and a pair of adjacent first insulating lines 110.

Figure 14A:
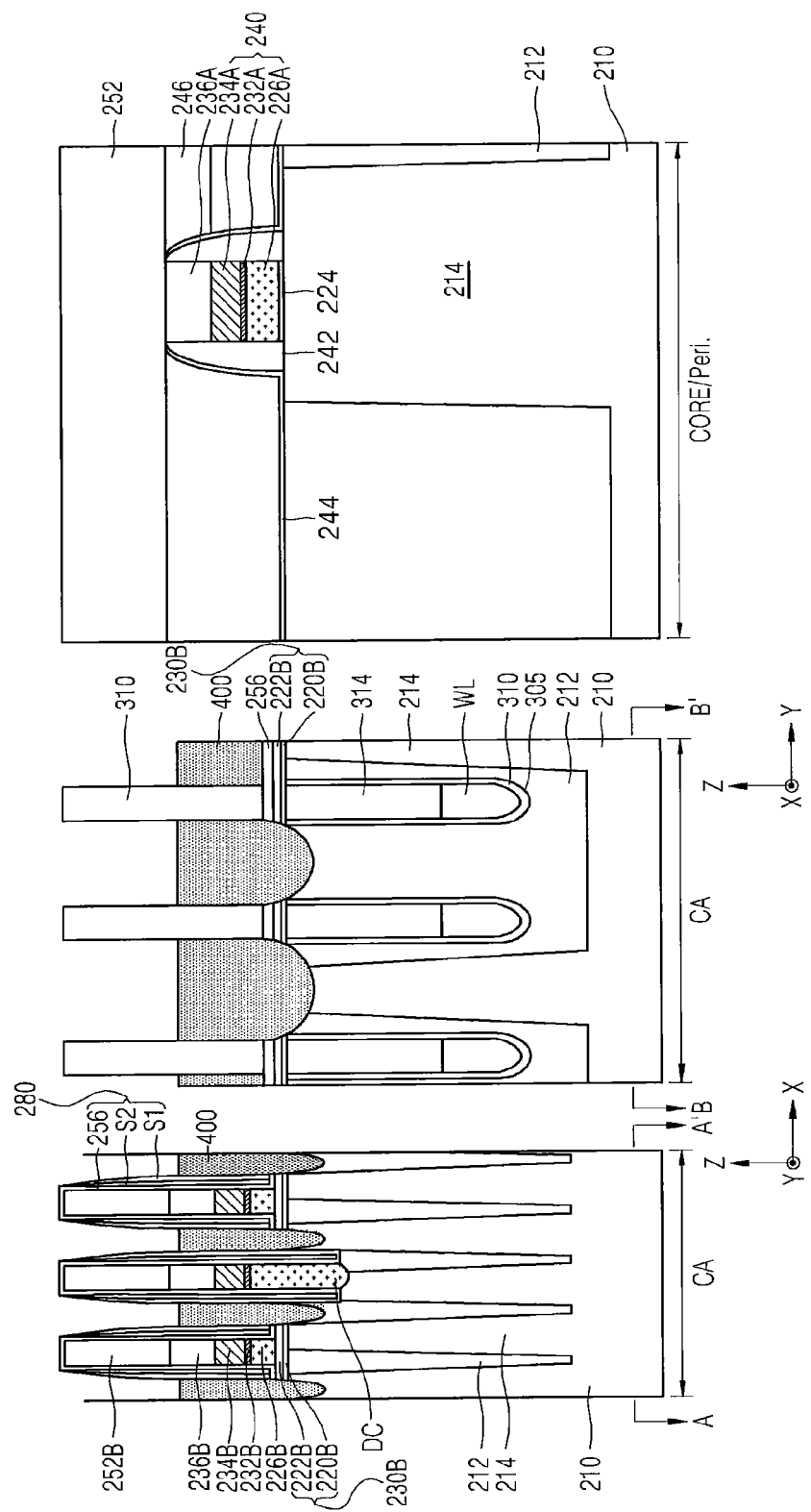

Referring to FIG. 14A, in the cell array area CA, a lower portion of the inside of each of the plurality of holes BCH is filled with a conductive layer to thereby form first contact structures 400 that are connected to the active region 214. Referring to the A-A' line cross-section, the first contact structures 400 are formed in the plurality of holes BCH between the bit lines 260. In some embodiments, the first contact structures 400 may cover sidewalls of insulating spacers S1 and S2 formed at sidewalls of the bit lines 260 and sidewalls of the first insulating lines 310.

Referring to the B-B' line cross-section, first contact structures 400 are formed in a plurality of holes BCH between the first insulating lines 310. In some embodiments, the upper surfaces of the bit lines 260 and the upper surfaces of the first contact structures 400 may be etched so that the levels of the upper surfaces of the bit lines 260 and the levels of the upper surfaces of the first contact structures 400 are approximately equal to each other.

Figure 14B:
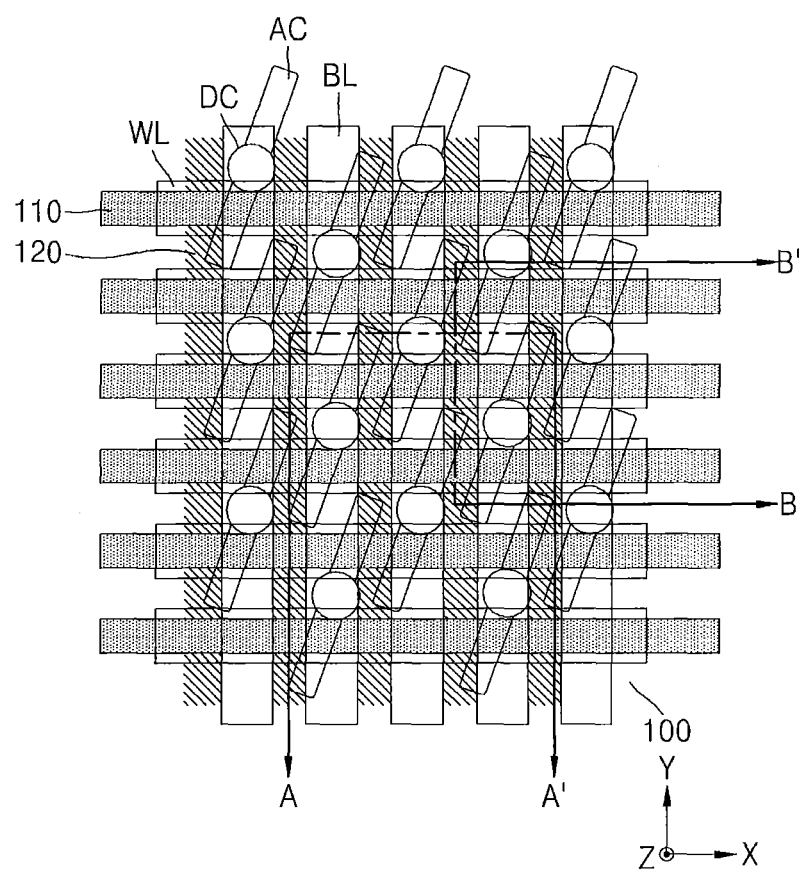

FIG. 14B is a schematic layout of the cell array area CA illustrated in FIG. 14A. The same reference names described with reference to FIG. 14A and FIG. 14B denote the same elements although reference numerals differ. A bit line structure BL of FIG. 14B is a structure in which the bit line 260 and the spacer 280 of FIG. 14A are combined with each other.

Referring to FIG. 14B, a plurality of areas that are defined by a plurality of bit line structures BL and a plurality of first insulating lines 110 are filled with a conductive layer to thereby form the plurality of first contact structures 400.

Figure 15:
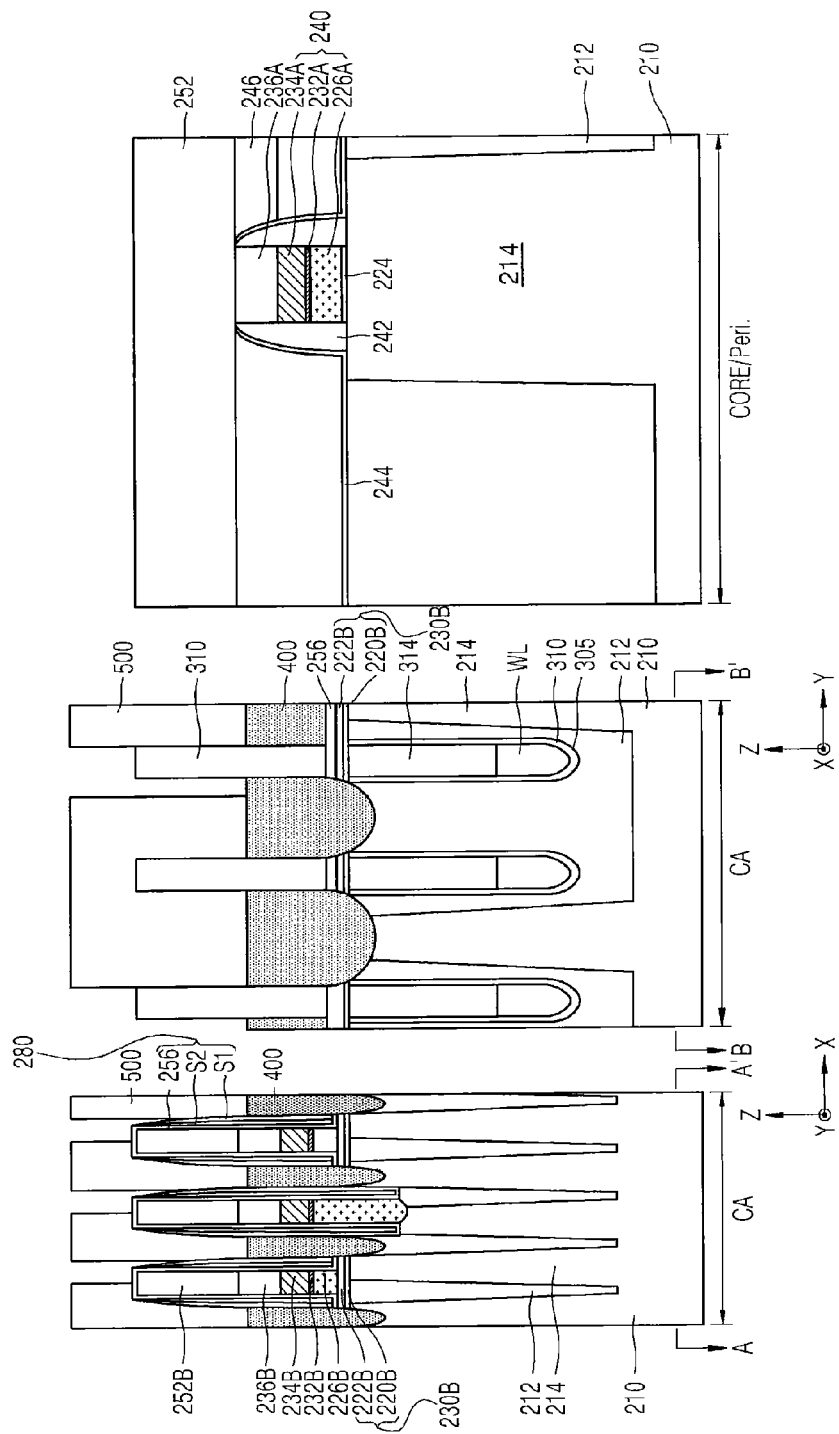

Referring to FIG. 15, an insulating material 500 is formed on the upper surface of a resultant structure of the cell array area CA of FIG. 14A. The insulating material 500 may be formed to cover the first insulating lines 310. A mask pattern (not shown), which defines a plurality of second insulating lines 510 extending in a direction between the X-axis direction and the Y-axis direction, is formed on the insulating material 500, and the insulating material 500 is etched by using the mask pattern as an etch mask.

Figure 16A:
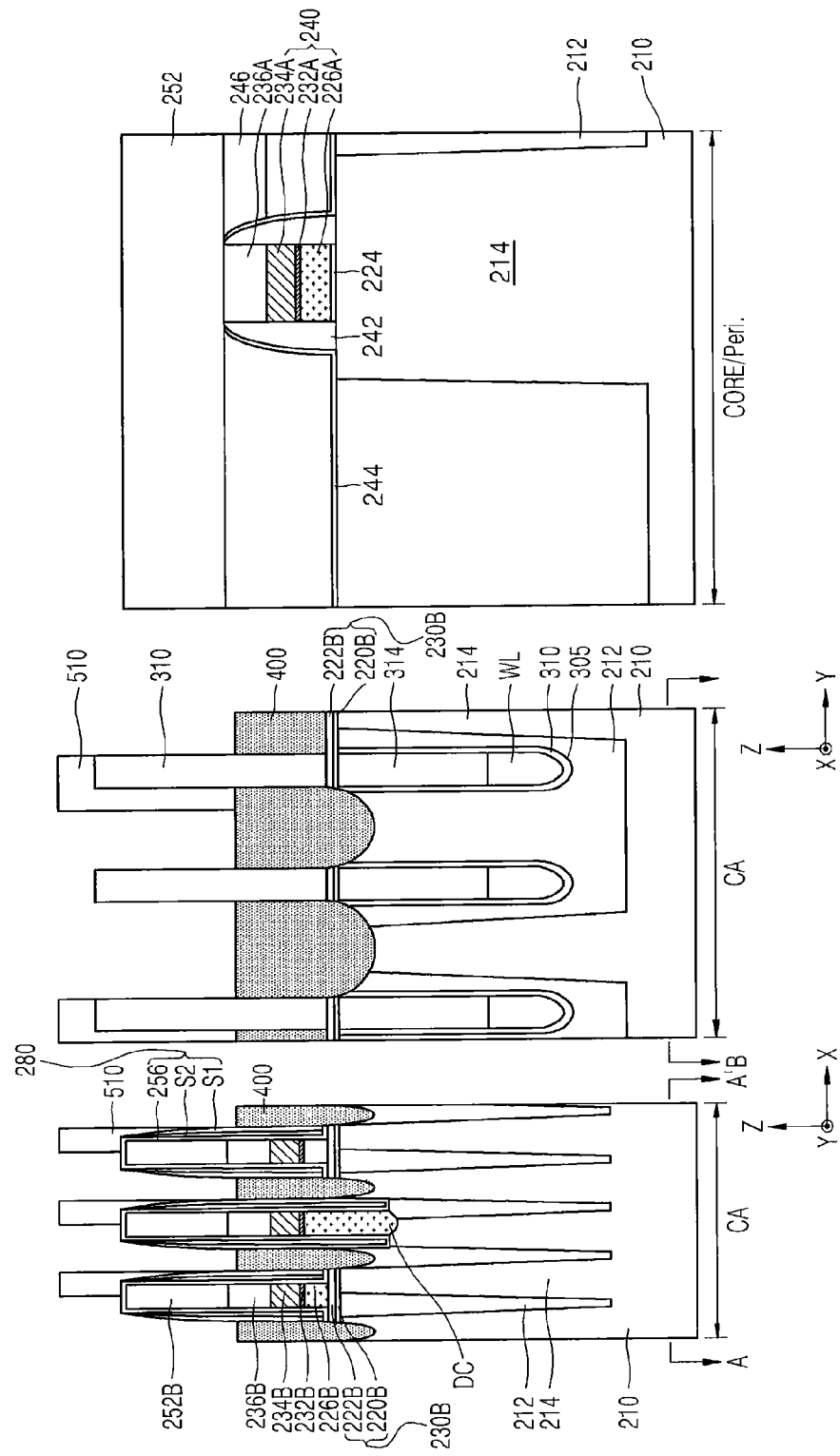

Referring to FIG. 16A, the insulating material 500 in a resultant structure of the cell array area CA of FIG. 15. is etched by using the mask pattern as an etch mask, and an area in which the insulating material 500 is etched is filled with a constituent material of the second insulating lines 510, and the insulating material 500 is etched to thereby form the second insulating lines 510. The insulating material 500 and the material of the second insulating lines 510 differ. In some embodiments, the second insulating lines 510 may be formed of silicon oxide, silicon nitride, or a combination thereof. However, the inventive concept is not limited thereto. In some embodiments, the second insulating lines 510 may be formed of the same material as the first insulating lines 310. In some embodiments, the insulating material 500 may be removed by using a wet etching process. Referring to the A-A' line cross-section of FIG. 16A, the second insulating lines 510 are formed to contact the upper surfaces and sidewalls of the bit lines 260. Referring to the B-B' line cross-section of FIG. 16A, the second insulating lines 510 are formed to contact the upper surfaces and sidewalls of some of the first insulating lines 310.

Figure 16B:
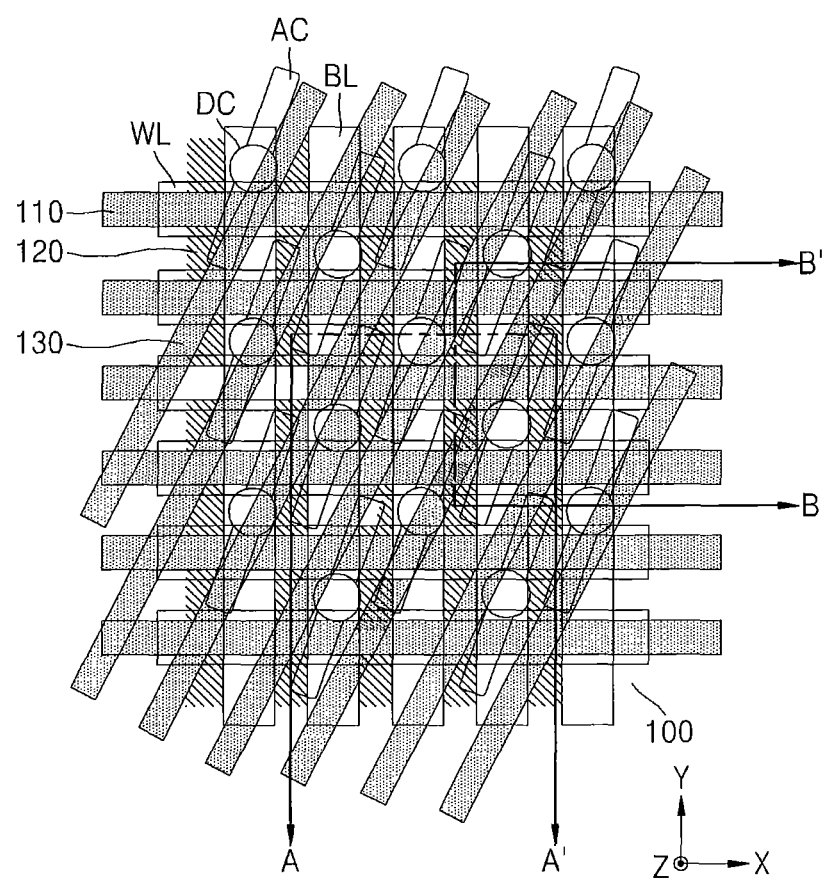

FIG. 16B is a schematic layout of the cell array area CA illustrated in FIG. 16A. The same reference names described with reference to FIG. 16A and FIG. 16B denote the same elements although reference numerals differ. A bit line structure BL of FIG. 16B is a structure in which the bit line 260 and the spacer 280 of FIG. 16A are combined with each other.

Referring to FIG. 16B, first insulating lines 110 extend in the X-axis direction, and second insulating lines 130 extend in a direction between the X-axis direction and the Y-axis direction. The second insulating line 130 covers a portion of the upper surface of a first contact structure 120, a portion of the upper surface of the bit line structure BL, and a portion of the upper surface of the first insulating line 110. A plurality of second insulating lines 130 each are formed so as not to bisect the upper surface of the first contact structure 120.

Figure 17:
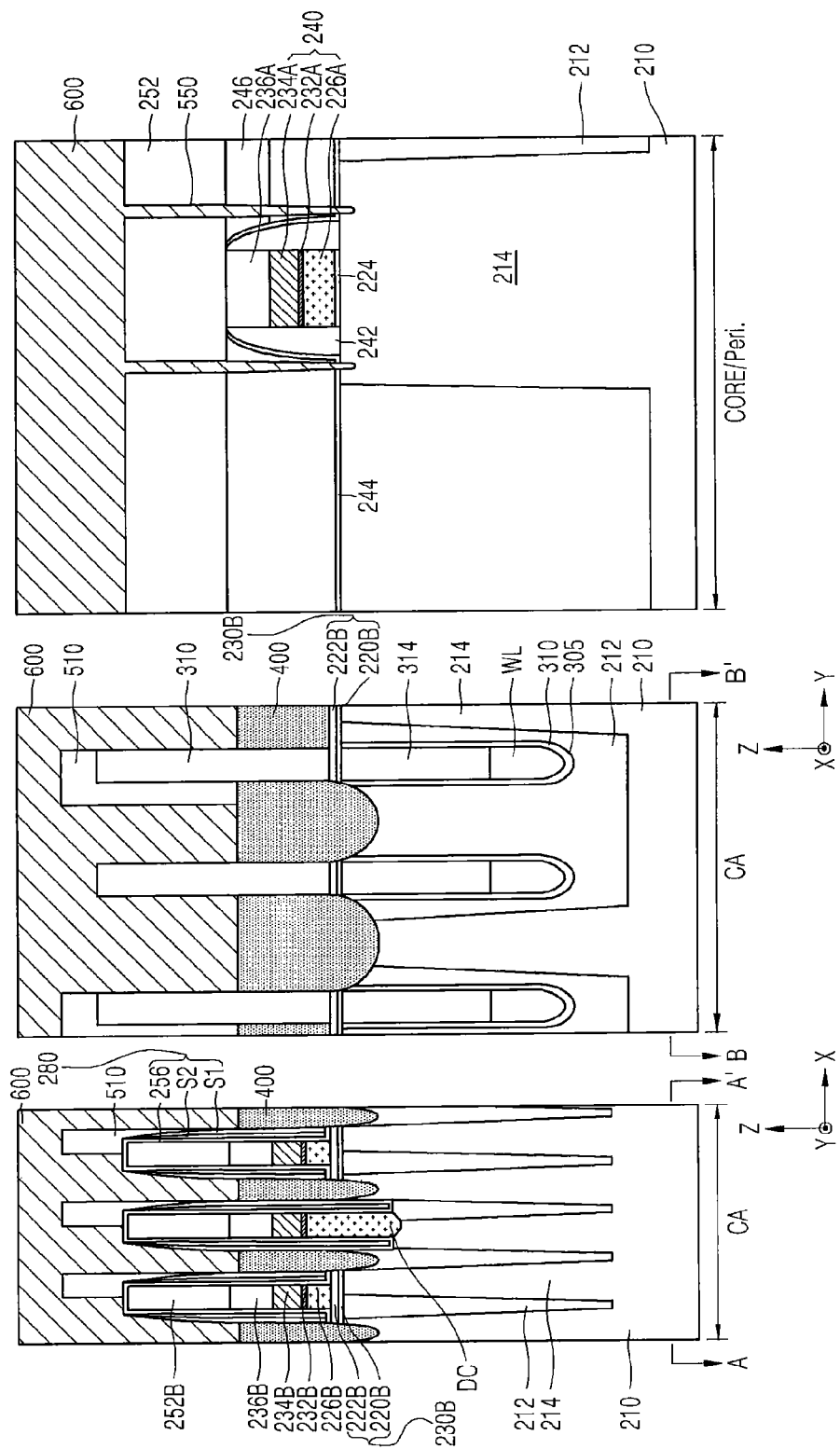

Referring to FIG. 17, a conductive layer 600 is formed on the whole surface of a resultant structure including the cell array area CA and the core/peripheral area CORE/Peri. of FIG. 16A so as to cover a lower structure. In detail, trenches 550 that penetrate the interlayer insulating layer 246 and the insulating layer 252 and expose the active region 214 are formed in the core/peripheral area CORE/Peri. Next, a conductive layer 600 is formed on the whole surface of a resultant structure with the trenches 550 formed therein. The conductive layer 600 filled in the trenches 550 electrically connects the active region 24 to an upper interconnection line. In some embodiments, the conductive layer 600 may be formed by using a damascene process.

Figure 18A:
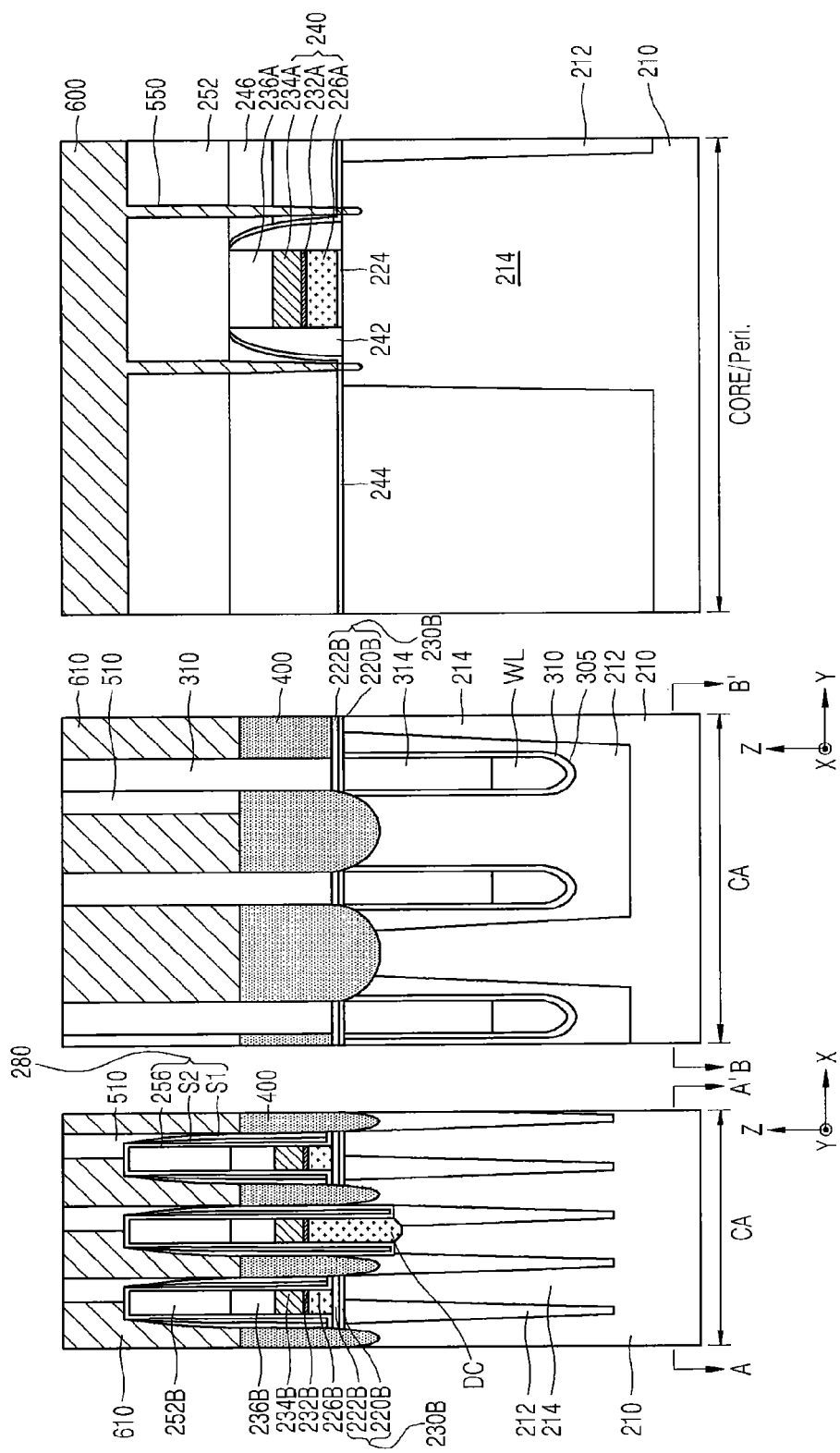

Referring to FIG. 18A, an upper side portion of a resultant structure including the cell array area CA and the core/peripheral area CORE/Peri. of FIG. 17 is removed. For example, the upper side portion of the resultant structure may be removed by an etch back or CMP process. As a result, the conductive layer 600 is divided into several conductive lines due to the first insulating lines 310 and the second insulating lines 510 to thereby form a second contact structure 610. Referring to the A-A' line cross-section of FIG. 18A, a cross-section of the second contact structure 610 formed by division by the second insulating lines 510 is shown. Referring to the B-B' line cross-section of FIG. 18A, a cross-section of the second contact structure 610 formed by division by the first insulating lines 310 and the second insulating lines 510 is shown. The second contact structure 610 may have a level that is about the same as those of the upper surfaces of the second insulating lines 510 or those of the upper surfaces of the first insulating lines 310. In the semiconductor device 30 manufactured by the method described above, there may be little to no variation between a plurality of second contact structures 610 because the plurality of second contact structures 610 are formed at one time, and thus, a stable structure thereof may be obtained. In addition, an interconnection process may be performed only in the core/peripheral area CORE/Peri., and thus, a process margin may be increased.

A plurality of capacitors are formed on the upper surfaces of the plurality of second contact structures 610 to thereby form the semiconductor device 30 of FIG. 2. In detail, referring back to FIG. 2, a plurality of insulating patterns 730 having a plurality of storage node holes are formed on the upper surfaces of the first insulating lines 310, the upper surfaces of the second insulating lines 510, and the upper surfaces of the second contact structures 610 so that the upper surfaces of the second contact structures 610 are exposed. One insulating pattern 730 is formed so that only the upper surface of one of the second contact structures 610 corresponding thereto is exposed. A first conductive layer, a dielectric layer, and a second conductive layer may be sequentially formed in each of the plurality of storage node holes to thereby form a capacitor. The capacitor includes a lower electrode 700, a dielectric layer 710, and an upper electrode 720.

Figure 18B:
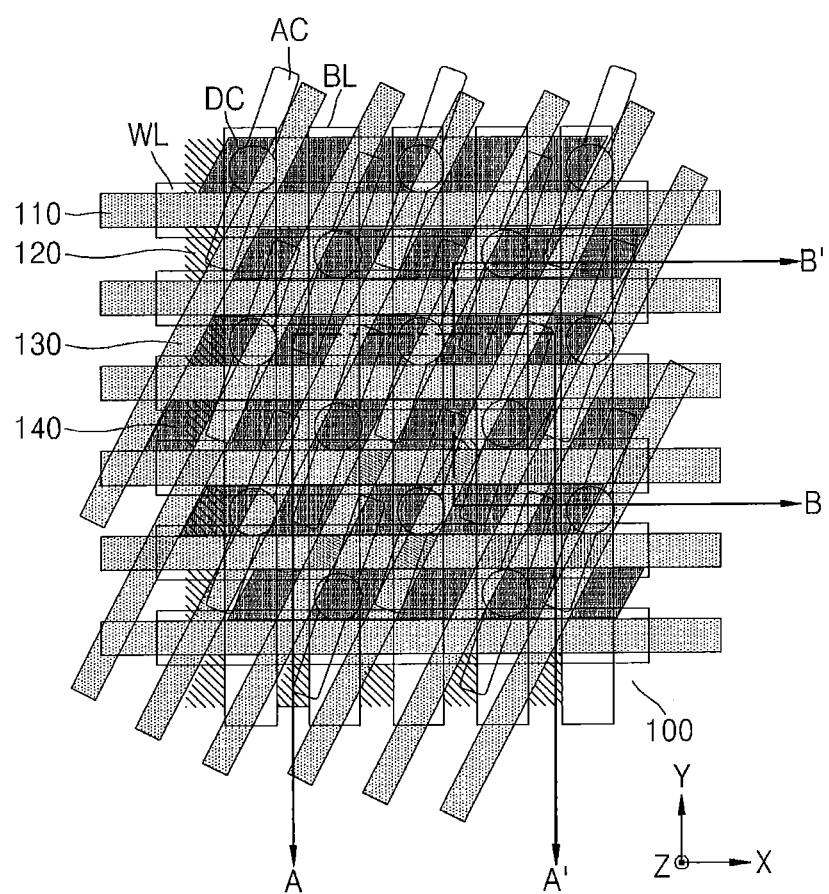

FIG. 18B is a schematic layout of the cell array area CA illustrated in FIG. 18A. The same reference names described with reference to FIG. 18A and FIG. 18B denote the same elements although reference numerals differ. A bit line structure BL of FIG. 18B is a structure in which the bit line 260 and the spacer 280 of FIG. 18A are combined with each other.

Referring to FIG. 18B, a plurality of second contact structures 140 are formed in a plurality of areas that are defined by a pair of first insulating lines 110 and a pair of second insulating lines 130. One of the second contact structures 140 is disposed to be connected to the upper surface of one of the first contact structures 120 corresponding thereto.

In some embodiments, a lower capacitor electrode ST is formed on the upper surface of each of the second contact structures 140 to thereby form the semiconductor device 10 of FIG. 1A. One lower capacitor electrode ST is connected to the upper surface of one of the second contact structures 140 corresponding thereto.

In some embodiments, a plurality of insulating patterns 150 (refer to FIG. 1C) having a plurality of storage node holes that expose the upper surfaces of the second contact structures 140 may be formed on the upper surfaces of the first insulating lines 110, the upper surfaces of the second insulating lines 130, and the upper surfaces of the second contact structures 140. One insulating pattern 150 is formed so that only the upper surface of one of the second contact structures 140 corresponding thereto is exposed. In some embodiments, when forming the storage node holes at regular intervals, insulating patterns 150 remaining after defining the storage node holes may have a plurality of third insulating lines 153 that are parallel to one another and a plurality of fourth insulating lines 155 that are parallel to one another. Because each of the third insulating lines 153 and each of the fourth insulating lines 155 may have the same shape and size as each of the first insulating lines 110 and each of the second insulating lines 130, respectively, the misalignment of a storage node hole defined by a pair of third insulating lines 153 and a pair of fourth insulating lines 155 and the misalignment of a second contact structure 140 defined by a pair of first insulating lines 110 and a pair of second insulating lines 130 may be greatly improved.

A lower capacitor electrode ST is formed in each of the storage node holes to thereby form the semiconductor device 20 of FIG. 1C.

Figure 19:
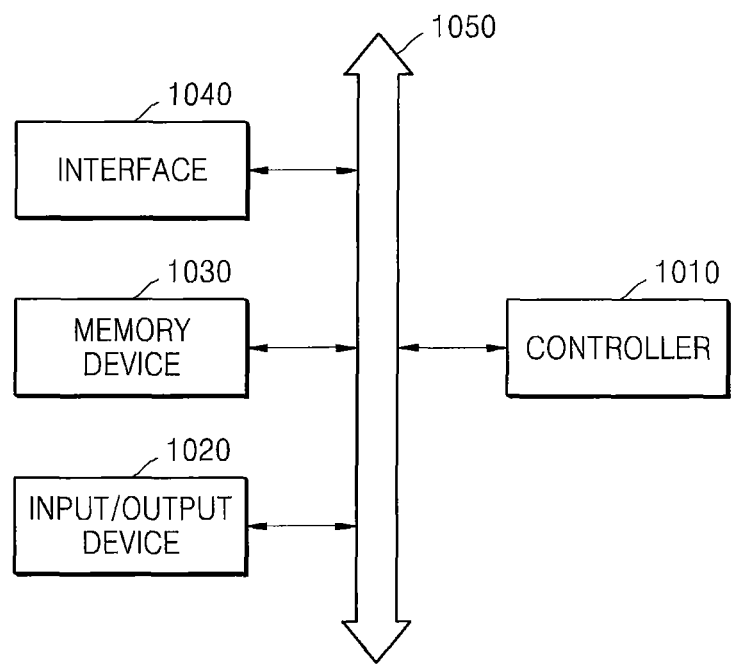
FIG. 19 is a block diagram of a system including a semiconductor device according to an embodiment of the inventive concept.

FIG. 19 is a block diagram of a system 1000 including a semiconductor device according to an embodiment of the inventive concept.

The system 1000 includes a controller 1010, an input/output device 1020, a memory device 1030, and an interface 1040. The system 1000 may be a mobile system and/or a system for transmitting and/or receiving information. In some embodiments, the mobile system may be, for example, a personal digital assistant (PDA), a portable computer, a web tablet, a wireless phone, a mobile phone, a digital music player, or a memory card. The controller 1010, which controls an execution program in the system 1000, may be a microprocessor, a digital signal processor, a microcontroller, or a similar device. The input/output device 1020 may be used to input or output data to or from the system 1000. The system 1000 may be connected to an external device, e.g., a personal computer (PC) or a network, by using the input/output device 1020 and may exchange data with the external device. The input/output device 1020 may be, for example, a keypad, a keyboard, or a display.

The memory device 1030 may store codes and/or data for an operation of the controller 1010 or may store data processed by the controller 1010. The memory device 1030 may include a semiconductor device according to the above-described embodiments of the inventive concept. For example, the memory device 1030 may include at least one of the semiconductor devices described with reference to FIGS. 1A to 18B.

The interface 1040 may be a data transmission path between the system 1000 and an external device. The controller 1010, the input/output device 1020, the memory device 1030, and the interface 1040 may communicate with each other via a bus 1050. The system 1000 may be used, for example, in mobile phones, MP3 players, navigation system, portable multimedia players (PMPs), solid state disks (SSDs), and household appliances.

Figure 20:
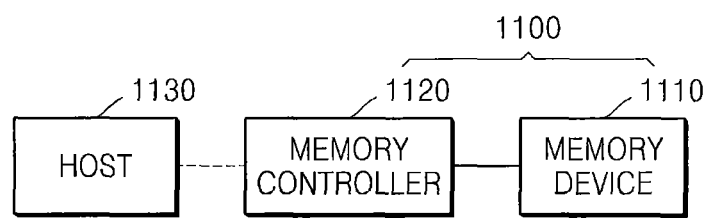
FIG. 20 is a block diagram of a memory card including a semiconductor device according to an embodiment of the inventive concept.

FIG. 20 is a block diagram of a memory card 1100 including a semiconductor device according to an embodiment of the inventive concept.

The memory card 1100 includes a memory device 1110 and a memory controller 1120.

The memory device 1110 may store data. In some embodiments, the memory device 1110 may have nonvolatile characteristics by which data may be maintained intact although the power supply is discontinued. The memory device 1110 includes a semiconductor device according to the above-described embodiment of the inventive concept. For example, the memory device 1110 includes at least one of the semiconductor devices described with reference to FIGS. 1A to 18B.

The memory controller 1120 may read data stored in the memory device 1110 in response to a read request of a host 1130 or may store data in the memory device 1110 in response to a write request of the host 1130. The memory controller 1120 includes a semiconductor device according to the above-described embodiments of the inventive concept. For example, the memory controller 1120 includes at least one of the semiconductor devices described with reference to FIGS. 1A to 18B.

While the inventive concept has been particularly shown and described with reference to exemplary embodiments thereof, it will be understood that various changes in form and details may be made therein without departing from the spirit and scope of the following claims.

What is claimed is:

1. A method of manufacturing a semiconductor device, the method comprising:
    forming a device isolation layer in a substrate to define a plurality of active regions disposed proximal to an upper surface of the substrate;
    forming a plurality of bit lines extending in a first direction on the substrate;
    forming a plurality of first insulating lines extending in a second direction that is different from the first direction, wherein the plurality of first insulating lines intersect the plurality of bit lines and have upper surfaces having levels which are higher than those of upper surfaces of the plurality of bit lines relative to the upper surface of the substrate where the upper surface of the substrate is beneath both the upper surfaces of the first insulating lines and the upper surfaces of the bit lines;
    forming a plurality of first contact structures being disposed in an area defined by the plurality of bit lines and the plurality of first insulating lines, the plurality of first contact structures being connected to the plurality of active regions;
    forming a plurality of second insulating lines extending in a third direction that is diagonal in relation to the second direction, the plurality of second insulating lines intersect the plurality of first insulating lines; and
    wherein before forming the plurality of bit lines, forming a plurality of word lines buried in the substrate and a buried insulating layer that covers upper surfaces of the word lines at a same level as the upper surface of the substrate, wherein the plurality of first insulating lines overlap with the plurality of word lines.

2. The method of claim 1, wherein the third direction is not perpendicular to the second direction.

3. The method of claim 1, wherein forming the plurality of first insulating lines comprises:
    forming an insulating material on the substrate, the insulating material has a upper surface of which a level are higher than those of upper surfaces of the a plurality of the bit lines and covers the upper surfaces a plurality of the bit lines;
    etching a portion of the insulating material to define a space in which the plurality of the first insulating lines are formed;

forming the plurality of first insulating lines by filling the space defined by the insulating material with a constituent material of the first insulating lines, and etching a remaining portion of the insulating material.

4. The method of claim 1, further comprising forming a plurality of second contact structures disposed in an area isolated by the plurality of first insulating lines and the plurality of second insulating lines, the plurality of second contact structures are connected to the plurality of first contact structures wherein one of the first contact structures is disposed to be connected to one of the second contact structures corresponding thereto.

5. The method of claim 4, wherein forming the plurality of second insulating lines comprises:

forming an insulating material on the substrate, the insulating material has a upper surface of which a level are higher than those of upper surfaces of the a plurality of the bit lines and covers the upper surfaces the plurality of the hit lines and the first contact structures;

etching a portion of the insulating material to define a space in which the plurality of the second insulating lines are formed;

forming the plurality of second insulating lines by filling the space defined by the insulating material with a constituent material of the second insulating lines, and etching a remaining portion of the insulating material.

6. The method of claim 4, wherein the levels of upper surfaces of the plurality of first insulating lines are substantially equal to those of upper surfaces of the plurality of second insulating lines.

7. The method of claim 1, further comprising, between forming the plurality of bit lines and forming the plurality of first insulating lines, forming an insulating spacer disposed at a sidewall of each of the plurality of bit lines, wherein the insulating spacer is formed of a same material as the plurality of first insulating lines.

8. A method of manufacturing a semiconductor device, the method comprising:

forming a device isolation layer in a substrate to define a plurality of active regions disposed proximal to an upper surface of the substrate;

forming a plurality of bit lines extending in a first direction on the substrate;

forming a plurality of first insulating lines extending in a second direction that is different from the first direction and intersecting the plurality of bit line;

forming a plurality of first contact structures being defined by the plurality of bit lines and the plurality of first insulating lines;

forming a plurality of second insulating lines extending in a third direction that is diagonal in relation to the second direction and intersecting the plurality of first insulating line;

forming a plurality of second contact structures disposed in an area isolated by the plurality of first insulating lines and the plurality of second insulating lines, a horizontal section of each of the second contact structures has a parallelogram shape; and wherein before forming the plurality of bit lines, forming a plurality of word lines buried in the substrate and a buried insulating layer that covers upper surfaces of the word lines at a same level as the upper surface of the substrate, wherein the plurality of first insulating lines overlap with the plurality of word lines.

9. The method of claim 8, wherein the third direction is not perpendicular to the second direction and a horizontal section of each of the second contact structures has not a rectangular shape.

10. The method of claim 8, wherein the second direction is perpendicular to the first direction and a horizontal section of each of the first contact structures has a rectangular shape.

11. The method of claim 10, wherein the plurality of first contact structures are formed of a same material as the plurality of second contact structures.

12. The method of claim 8, wherein the plurality of first contact structures each have a horizontal cross-sectional area having a first size, and the plurality of second contact structures each have a horizontal cross-sectional area having a second size that is larger than the first size.

13. The method of claim 8, wherein the plurality of first contact structures connected to the plurality of active regions, and wherein one of the first contact structures is disposed to be connected to one of the second contact structures corresponding thereto.

14. The method of claim 8, wherein the plurality of first insulating lines have upper surfaces having levels which are higher than those of upper surfaces of the plurality of bit lines relative to the substrate; and wherein the levels of upper surfaces of the plurality of first insulating lines are substantially equal to those of upper surfaces of the plurality of second insulating lines.

* * * * *